(12) United States Patent
Ryu

(10) Patent No.: US 11,764,237 B2
(45) Date of Patent: Sep. 19, 2023

(54) IMAGE SENSING DEVICE WHICH DIRECTLY COMPENSATES OR INVERSELY COMPENSATES FOR READOUT DEVIATIONS AMONG PIXEL SIGNALS

(71) Applicant: SK hynix Inc., Gyeonggi-do (KR)

(72) Inventor: Choong-Sik Ryu, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 560 days.

(21) Appl. No.: 16/859,529

(22) Filed: Apr. 27, 2020

(65) Prior Publication Data
US 2021/0082980 A1 Mar. 18, 2021

(30) Foreign Application Priority Data
Sep. 17, 2019 (KR) .......................... 10-2019-0114099

(51) Int. Cl.
*H01L 27/146* (2006.01)
*H04N 25/713* (2023.01)

(52) U.S. Cl.
CPC .. *H01L 27/14609* (2013.01); *H01L 27/14643* (2013.01); *H04N 25/713* (2023.01)

(58) Field of Classification Search
CPC ......... H01L 27/14609; H01L 27/14643; H01L 27/14636; H04N 5/37213; H04N 5/3658; H04N 5/378; H04N 5/374
See application file for complete search history.

(56) References Cited

U.S. PATENT DOCUMENTS 9,940,871 B2 * 4/2018 Lee ...................... G09G 3/3208
10,249,248 B2 * 4/2019 Lee ...................... G09G 3/3233

FOREIGN PATENT DOCUMENTS

KR 10-2017-0046128 4/2017

* cited by examiner

*Primary Examiner* — Seung C Sohn
(74) *Attorney, Agent, or Firm* — IP & T GROUP LLP

(57) ABSTRACT

An image sensing device includes a pixel array including a plurality of pixels arranged in rows and columns, and suitable for outputting a plurality of pixel signals, and a plurality of readout circuits coupled to the pixel array, and suitable for compensating for readout deviations among the plurality of pixel signals when reading out the plurality of pixel signals.

20 Claims, 22 Drawing Sheets

123_0

123_0

IMAGE SENSING DEVICE WHICH DIRECTLY COMPENSATES OR INVERSELY COMPENSATES FOR READOUT DEVIATIONS AMONG PIXEL SIGNALS

CROSS-REFERENCE TO RELATED APPLICATION

This application claims priority under 35 U.S.C. § 119 to Korean Patent Application No. 10-2019-0114099, filed on Sep. 17, 2019, the disclosure of which is incorporated herein by reference in its entirety.

BACKGROUND

1. Field

Various embodiments of the present invention relate to a semiconductor design technique, and more particularly, to an image sensing device.

2. Description of the Related Art

Image sensing devices capture images using the photosensitive property of semiconductors. Image sensing devices may be roughly classified into charge-coupled device (CCD) image sensors and complementary metal-oxide semiconductor (CMOS) image sensors. Since CMOS image sensors allow both analog and digital control circuits to be directly implemented on a single integrated circuit (IC), CMOS image sensors are widely used in the industry.

SUMMARY

Various embodiments of the present invention are directed to an image sensing device for reducing a deterioration in characteristics that occurs when pixel signals are read out.

In accordance with an embodiment, an image sensing device may include: a pixel array including a plurality of pixels arranged in rows and columns, and suitable for outputting a plurality of pixel signals; and a plurality of readout circuits coupled to the pixel array, and suitable for compensating for readout deviations among the plurality of pixel signals when reading out the plurality of pixel signals.

The plurality of readout circuits may directly compensate or inversely compensate for the readout deviations among the plurality of pixel signals by applying respective predetermined resistance values in a plurality of readout lines to which the plurality of pixel signals is read out.

The plurality of readout circuits may decrease the readout deviations among the plurality of pixel signals when compensating for the readout deviations among the plurality of pixel signals.

The plurality of readout circuits may increase the readout deviations among the plurality of pixel signals when compensating for the readout deviations among the plurality of pixel signals.

In accordance with an embodiment, an image sensing device may include: a pixel array including a plurality of pixels arranged in rows and columns, and suitable for outputting a plurality of pixel signals to a plurality of column lines; a plurality of detectors coupled to the plurality of column lines, and suitable for outputting a plurality of detection signals, corresponding to respective voltage levels of the pixel signals, to a plurality of readout lines; a plurality of counters coupled to the plurality of readout lines, and suitable for counting the plurality of detection signals, respectively; and a plurality of compensators coupled to the plurality of readout lines, and suitable for applying respective predetermined resistance values in the plurality of readout lines, wherein different predetermined resistance values are applied in each of the plurality of readout lines.

The respective predetermined resistance values may be set according to readout deviations among the plurality of pixel signals.

The respective predetermined resistance values may be set to decrease readout deviations among the plurality of pixel signals.

The respective predetermined resistance values may be set to increase readout deviations among the plurality of pixel signals.

Each of the compensators may include a load, and the load may include a non-salicide poly resistor.

Each of the compensators may include a load, and the load may include a metal resistor.

In accordance with an embodiment, an image sensing device may include: a pixel array including a plurality of pixels arranged in rows and columns, and suitable for outputting a plurality of pixel signals to a plurality of column lines; a plurality of detectors coupled to the plurality of column lines, and suitable for outputting a plurality of detection signals, corresponding to respective voltage levels of the pixel signals, to a plurality of readout lines; a plurality of counters coupled to the plurality of readout lines, and suitable for counting the plurality of detection signals, respectively; and a plurality of compensators coupled to the plurality of readout lines, and suitable for selectively applying one of two or more resistance values in each of the readout lines under the control of two or more common control signals.

The plurality of compensators may apply different resistance values in two or more of the readout lines.

The two or more resistance values may include first and second resistance values, the first resistance value may be set to decrease readout deviations among the plurality of pixel signals, and the second resistance value may be set to increase readout deviations among the plurality of pixel signals.

Each of the compensators may include: a first load; a second load; a first switch suitable for selectively coupling the first load to each of the readout lines under the control of a first common control signal of the common control signals; and a second switch suitable for selectively coupling the second load to each of the readout lines under the control of a second common control signal of the common control signals.

Each of the first and second loads may include a non-salicide poly resistor.

Each of the first and second loads may include a metal resistor.

Each of the compensators may include: a plurality of loads; and a plurality of switches suitable for selectively coupling one or more of the plurality of loads to each of the readout lines under the control of the common control signals.

The plurality of loads may have the same resistance value.

Each of the loads may include a non-salicide poly resistor.

Each of the loads may include a metal resistor.

These and other features and advantages of the present invention will become apparent to those skilled in the art of the invention from the following detailed description in conjunction with the following drawings.

DETAILED DESCRIPTION

Various embodiments are described below in more detail with reference to the accompanying drawings. These embodiments are provided so that this disclosure is thorough and complete, and fully conveys the scope of the present disclosure to those skilled in the art.

It will be understood that when an element is referred to as being "connected to", or "coupled to" another element, it may be directly on, connected to, or coupled to the other element, or one or more intervening elements may be present. In addition, it will also be understood that the terms "comprises," "comprising," "includes," and "including" when used in this specification, specify the presence of the stated elements and do not preclude the presence or addition of one or more other elements. As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

Figure 1:
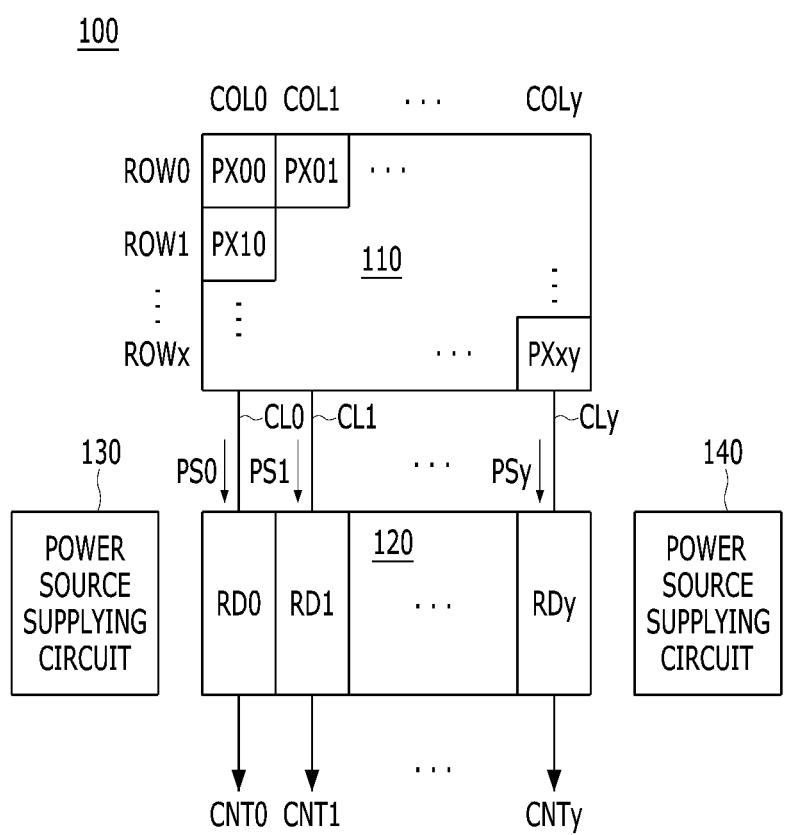
FIG. 1 is a block diagram illustrating an image sensing device in accordance with various embodiments of the present invention.

FIG. 1 is a block diagram illustrating an image sensing device 100 in accordance with various embodiments of the present invention.

Referring to FIG. 1, the image sensing device 100 may include a pixel region 110, a readout region 120 and power source supplying regions 130 and 140.

The pixel region 110 may include a pixel array. The pixel array may include a plurality of pixels PX00 to PXxy arranged along rows and columns (where x and y are natural numbers). For example, the plurality of pixels PX00 to PXxy may be arranged in first to $(x+1)^{th}$ rows ROW0 to ROWx and first to $(y+1)^{th}$ columns COL0 to COLy. The pixel array may output a plurality of pixel signals PS0 to PSy to a plurality of column lines CL0 to CLy. For example, the first to $(y+1)^{th}$ pixels PX00 to PX0y arranged in the first row ROW0 may output the first to $(y+1)^{th}$ pixel signals PS0 to PSy to the first to $(y+1)^{th}$ column lines CL0 to CLy during a first single row time period, and the first to $(y+1)^{th}$ pixels PXx0 to PXxy arranged in the $(x+1)^{th}$ row ROWx may output the first to $(y+1)^{th}$ pixel signals PS0 to PSy to the first to $(y+1)^{th}$ column lines CL0 to CLy during a $(x+1)^{th}$ single row time period.

The readout region 120 may include a plurality of readout circuits RD0 to RDy. The plurality of readout circuits RD0 to RDy may be coupled to the pixel array through the plurality of column lines CL0 to CLy, and read out the plurality of pixel signals PS0 to PSy. For example, the first to $(y+1)^{th}$ readout circuits RD0 to RDy may be coupled to the first to $(y+1)^{th}$ column lines CL0 to CLy to read out the first to $(y+1)^{th}$ pixel signals PS0 to PSy from the first to $(y+1)^{th}$ column lines CL0 to CLy, and then output them as first to $(y+1)^{th}$ count signals CNT0 to CNTy.

The plurality of pixel signals PS0 to PSy may suffer from delays in time when reading out by the plurality of readout circuits RD0 to RDy (hereinafter simply referred to as a readout time delay). The readout time delays caused by the plurality of readout circuits RD0 to RDy may be different for each of the plurality of pixel signals PS0 to PSy. Herein the term readout deviation will be used to refer to differences among the readout time delays of the plurality of pixel signals PS0 to PSy. In an embodiment of the present invention, the plurality of readout circuits RD0 to RDy may compensate for readout deviations among the plurality of pixel signals PS0 to PSy when reading out the pixel signals PS0 to PSy. For example, the plurality of readout circuits RD0 to RDy may compensate for the readout deviations among the plurality of pixel signals PS0 to PSy by applying respective predetermined resistance values in each path within the plurality of readout circuits RD0 to RDy, each path carrying out the corresponding pixel signal of the plurality of pixel signals PS0 to PSy, thereby directly compensating for the readout deviations among the plurality of pixel signals PS0 to PSy. The direct compensation for the readout deviations refers to decreasing the readout deviations among the plurality of pixel signals PS0 to PSy. To this end, the resistance values in each path within the plurality of readout circuits RD0 to RDy may be set so that the readout deviations among the plurality of pixel signals PS0 to PSy can be decreased.

The power source supplying regions 130 and 140 may include power source supplying circuits 130 and 140, respectively. The power source supplying circuits 130 and 140 may generate a power source necessary for the readout region 120, and supply the power source to the readout region 120. For example, the power source supplying circuits 130 and 140 may supply the power source in common to the plurality of readout circuits RD0 to RDy included in the readout region 120. The power source supplying circuit 130 may be disposed closest to the first readout circuit RD0 among the plurality of readout circuits RD0 to RDy, and the power source supplying circuit 140 may be disposed closest to the $(y+1)^{th}$ readout circuit RDy among the plurality of readout circuits RD0 to RDy.

Figure 2:
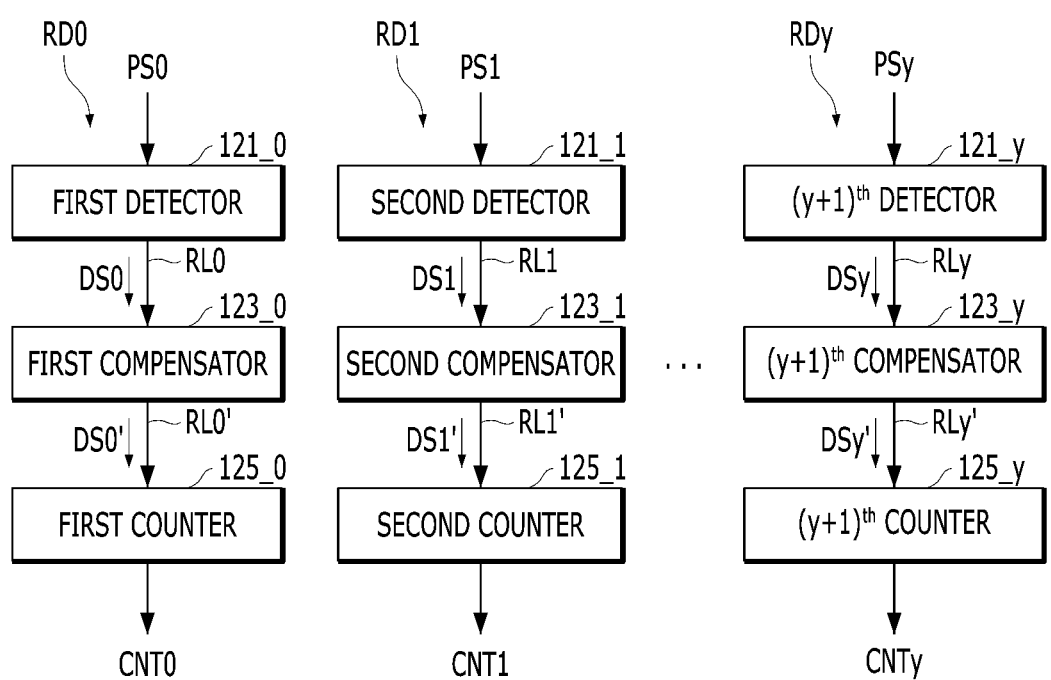
FIG. 2 is a block diagram illustrating a plurality of readout circuits of the image sensing device of FIG. 1 in accordance with various embodiments of the present invention.

FIG. 2 is a block diagram illustrating the plurality of readout circuits RD0 to RDy of FIG. 1 in accordance with various embodiments of the present invention.

Referring to FIG. 2, the first readout circuit RD0 may include a first detector 121_0, a first compensator 123_0 and a first counter 125_0.

The first detector 121_0 may be coupled to the first column line CL0. The first detector 121_0 may receive the first pixel signal PS0 through the first column line CL0, and output a first detection signal DS0, corresponding to a voltage level of the first pixel signal PS0, to the first readout line RL0 (hereinafter referred to as a "first initial readout line").

The first compensator 123_0 may be coupled to the first initial readout line RL0. The first compensator 123_0 may apply the predetermined resistance value in the first initial readout line RL0. For example, the first detection signal DS0 on the first readout line RL0 has a readout time delay when detected by the first detector 121_0. An amount of the readout time delay of the first detection signal DS0 may be different from an amount of the readout time delay for each of the second to the $(y+1)^{th}$ detection signal DSy on the second to the $(y+1)^{th}$ readout lines RL0 to RLy. For direct compensation according to various embodiments of the present invention, the first compensator 123_0 may adjust the readout time delay of the first detection signal DS0 so that the difference between the readout time delay of the first detection signal DS0 and the readout time delays of the second to the $(y+1)^{th}$ detection signal DSy may be decreased by applying the predetermined resistance value in the first initial readout line RL0 using a load (not shown) having the predetermined resistance value as the first compensator 123_0 (as described in more detail below in FIGS. 3 to 5). The first compensator 123_0 may output the directly compensated first detection signal DS0 as a delayed first detection signal DS0' to a first readout line RL0' (hereinafter referred to as a "first last readout line").

The first counter 125_0 may be coupled to the first last readout line RL0'. The first counter 125_0 may count the delayed first detection signal DS0', and output the first count signal CNT0.

Since the second to $(y+1)^{th}$ readout circuits RD1 to RDy may be configured similarly to the first readout circuit RD0, descriptions thereof will be omitted for clarity. However, a resistance value set in at least one of second to $(y+1)^{th}$ compensators 123_1 to 123_y may be different from the resistance value set in the first compensator 123_0. In other words, the plurality of compensators 123_0 to 123_y included in the plurality of readout circuits RD0 to RDy may apply different resistance values in two or more of the plurality of readout lines RL0 to Rly.

Figure 3A:
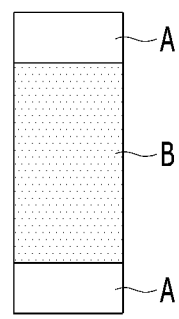
FIGS. 3A and 3B illustrate examples of a first compensator of the plurality of readout circuits of FIG. 2 in accordance with various embodiments of the present invention.
Figure 3B:

FIGS. 3A and 3B illustrate examples of the first compensator 123_0 of FIG. 2 in accordance with various embodiments of the present invention.

Referring to FIG. 3A, the first compensator 123_0 may include a first load. The first load may be a non-salicide poly resistor. The non-salicide poly resistor may include a salicide region A and a non-salicide region B. The salicide region A may have a relatively small resistance value, and the non-salicide region B may have a relatively large resistance value. A resistance value of the non-salicide poly resistor may be set by adjusting the size of each of the salicide and non-salicide regions A and B. For example, as the size of the non-salicide region B increases, the resistance value of the non-salicide poly resistor may increase, and as the size of the non-salicide region B decreases, the resistance value of the non-salicide poly resistor may decrease.

Each of the second to $(y+1)^{th}$ compensators 123_1 to 123_y may include the non-salicide poly resistor similar to the first compensator 123_0. However, the size of a non-salicide region included in at least one of the second to $(y+1)^{th}$ compensators 123_1 to 123_y may be different from the size of the non-salicide region B included in the first compensator 123_0.

Subsequently, referring to FIG. 3B, the first compensator 123_0 may include a second load. The second load may be a metal resistor. The metal resistor may include a metal line. A resistance value of the metal resistor may be set by adjusting the length of the metal line. For example, as the length of the metal line increases, the resistance value of the metal resistor may increase, and as the length of the metal line decreases, the resistance value of the metal resistor may decrease.

Each of the second to $(y+1)^{th}$ compensators 123_1 to 123_y may include the metal resistor similar to the first compensator 123_0. However, the length of a metal line included in at least one of the second to $(y+1)^{th}$ compensators 123_1 to 123_y may be different from the length of the metal line included in the first compensator 123_0.

Hereinafter, an operation of the image sensing device 100 having the above-described configuration according to various embodiment of the present invention will be described with reference to FIGS. 4, 5A and 5B.

Figure 4:
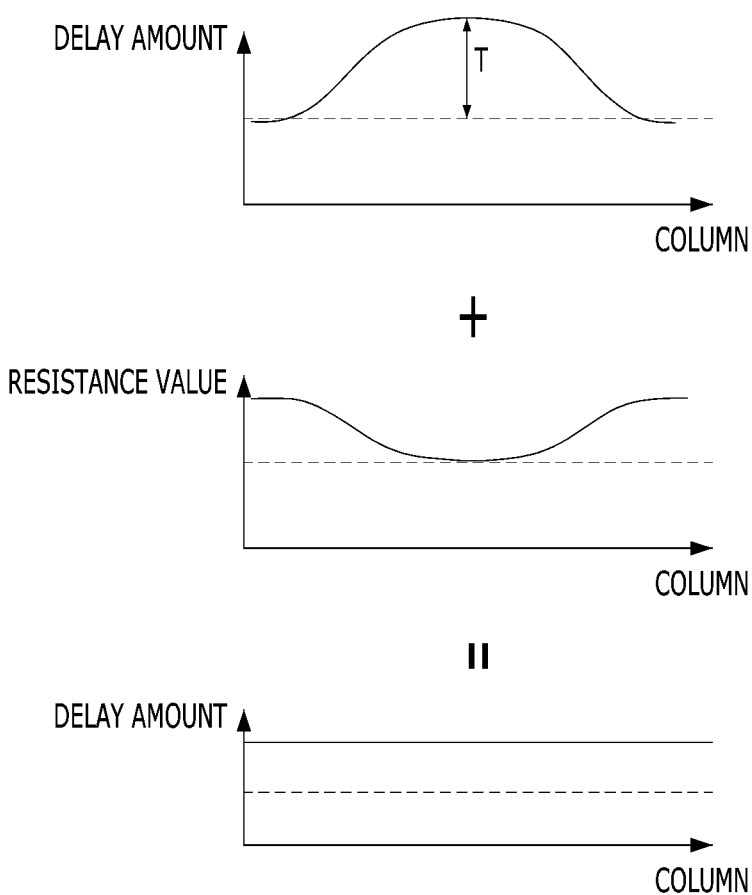
FIG. 4 is a graph showing a direct compensation operation of the image sensing device of FIG. 1 in accordance with various embodiments of the present invention.

FIG. 4 is a graph showing an operation of the image sensing device 100 of FIG. 1 in accordance with various embodiments of the present invention.

Referring to FIG. 4, readout deviations T may occur among the plurality of pixel signals PS0 to PSy. More particularly, the readout deviations T may occur among a plurality of detection signals DS0 to DSy. In FIG. 4, the graph representing the readout deviations T is illustrated in a convex shape in the center of the column-axis, since the power source supplying circuits 130 and 140 for supplying the power source in common to the plurality of readout circuits RD0 to RDy are disposed closest to the first readout circuit RD0 and the $(y+1)^{th}$ readout circuit RDy, respectively. Accordingly, the plurality of detection signals DS0 to DSy may be outputted with different readout time delays according to the different distances from the power source supplying circuits to the respective readout circuits, so that the readout deviations T may occur among the plurality of detection signals DS0 to DSy. Herein, the distance between the power source supplying circuit and the readout circuit may indicate a supplying time duration or a physical length of a path for supplying a power source from the power source supplying circuit to readout circuit.

The respective resistance values suitable to achieve the direct compensation may be preset in the plurality of compensators 123_0 to 123_y according to the readout deviations T. For example, the resistance values set in the compensators 123_0 to 123_y may be larger when the distances between the respective readout circuits and the power source supplying circuits decrease, and the resistance values set in the compensators 123_0 to 123_y may be smaller when the distances between the respective readout circuits and the power source supplying circuits increase. The plurality of compensators 123_0 to 123_y may directly compensate for the readout deviations T among the plurality of detection signals DS0 to DSy by applying the respective predetermined resistance values in the plurality of readout lines RL0 to RLy, based on the distances among the respective readout circuits and the power source supplying circuits. For example, the plurality of compensators 123_0 to 123_y may decrease the readout deviations T among the plurality of detection signals DS0 to DSy for the direct compensation of the readout deviations T. Accordingly, the plurality of delayed detection signals DS0' to DSy' outputted from the plurality of compensators 123_0 to 123_y may have the same readout time delays.

A plurality of counters 125_0 to 125_y may output the plurality of count signals CNT0 to CNTy corresponding to the plurality of delayed detection signals DS0' to DSy', respectively.

Figure 5A:
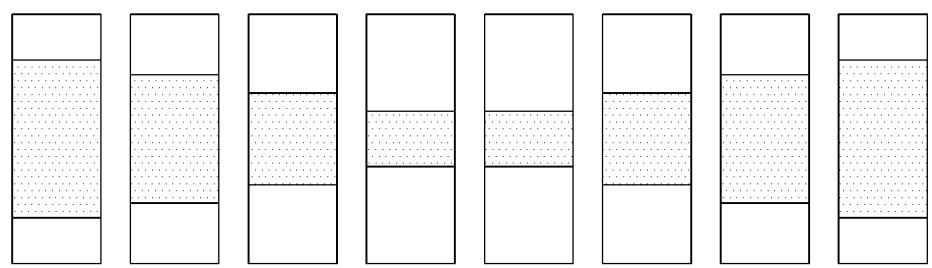
FIGS. 5A and 5B illustrate various implementations of the first compensator of FIGS. 3A and 3B in accordance with various embodiments of the present invention.
Figure 5B:
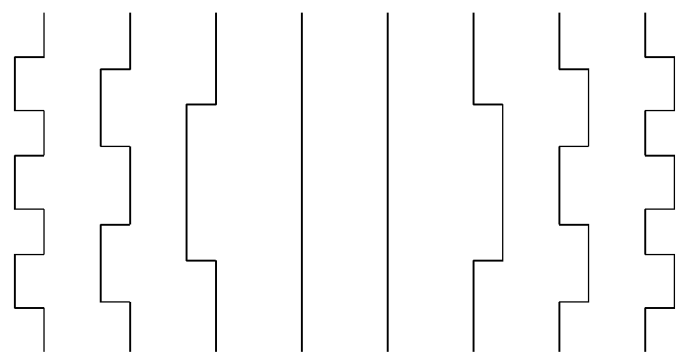

FIGS. 5A and 5B illustrate various implementations of the compensators 123_0 to 123_y of FIGS. 3A and 3B in accordance with various embodiments of the present invention. In FIGS. 5A and 5B, the compensators 123_0 to 123_y are illustrated as first to eighth compensators, i.e., y=7, for convenience in description.

Referring to FIGS. 5A and 5B, the fourth and fifth compensators disposed in the center of the first to eighth compensators may be set to have relatively small resistance values, and the first to third compensators and the sixth to eighth compensators may be set to have relatively large resistance values toward both ends thereof.

According to an embodiment, the readout deviations among the plurality of pixel signals may be directly compensated for, and thus alleviated.

Figure 6:
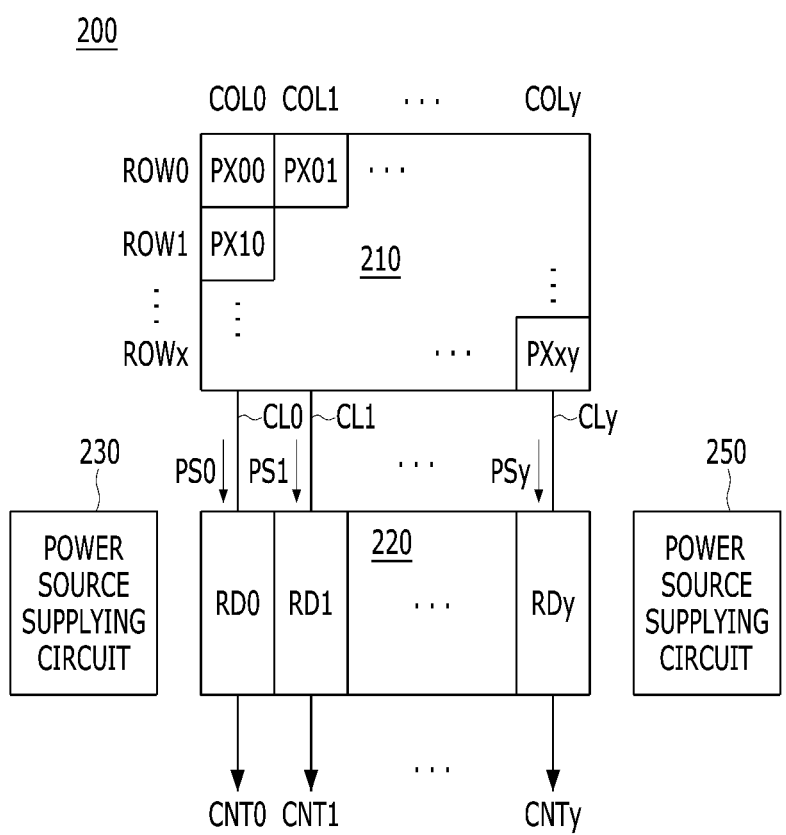
FIG. 6 is a block diagram illustrating an image sensing device in accordance with various embodiments of the present invention.

FIG. 6 is a block diagram illustrating an image sensing device 200 in accordance with various embodiments of the present invention.

Referring to FIG. 6, the image sensing device 200 may include a pixel region 210, a readout region 220 and power source supplying regions 230 and 250.

The pixel region 210 may include a pixel array. The pixel array may include a plurality of pixels PX00 to PXxy arranged along rows and columns (where x and y are natural numbers). For example, the plurality of pixels PX00 to PXxy may be arranged in first to $(x+1)^{th}$ rows ROW0 to ROWx and first to $(y+1)^{th}$ columns COL0 to COLy. The pixel array may output a plurality of pixel signals PS0 to PSy to a plurality of column lines CL0 to CLy. For example, the first to $(y+1)^{th}$ pixels PX00 to PX0y arranged in the first row ROW0 may output the first to $(y+1)^{th}$ pixel signals PS0 to PSy to the first to $(y+1)^{th}$ column lines CL0 to CLy during a first single row time period, and the first to $(y+1)^{th}$ pixels PXx0 to PXxy arranged in the $(x+1)^{th}$ row ROWx may output the first to $(y+1)^{th}$ pixel signals PS0 to PSy to the first to $(y+1)^{th}$ column lines CL0 to CLy during a $(x+1)^{th}$ single row time period.

The readout region 220 may include a plurality of readout circuits RD0 to RDy. The plurality of readout circuits RD0 to RDy may be coupled to the pixel array through the plurality of column lines CL0 to CLy, and read out the plurality of pixel signals PS0 to PSy. For example, the first to $(y+1)^{th}$ readout circuits RD0 to RDy may be coupled to the first to $(y+1)^{th}$ column lines CL0 to CLy, and read out the first to $(y+1)^{th}$ pixel signals PS0 to PSy, from the first to $(y+1)^{th}$ column lines CL0 to CLy, and then output the signals as first to $(y+1)^{th}$ count signals CNT0 to CNTy.

The plurality of readout circuits RD0 to RDy may compensate for readout deviations among the plurality of pixel signals PS0 to PSy when reading out the pixel signals PS0 to PSy. For example, the plurality of readout circuits RD0 to RDy may compensate for the readout deviations among the plurality of the pixel signals PS0 to PSy by applying respective predetermined resistance values in each path within the plurality of readout circuits RD0 to RDy, each path carrying out the corresponding pixel signal of the plurality of pixel signals PS0 to PSy, thereby inversely compensating for the readout deviations among the plurality of pixel signals PS0 to PSy. The inverse compensation for the readout deviations refers to increasing the readout deviations among the plurality of pixel signals PS0 to PSy. To this end, the resistance values in each path within the plurality of readout circuits RD0 to RDy may be set so that the readout deviations among the plurality of pixel signals PS0 to PSy can be increased.

The power source supplying regions 230 and 250 may include power source supplying circuits 230 and 250, respectively. The power source supplying circuits 230 and 250 may generate a power source necessary for the readout region 220, and supply the power source to the readout region 220. For example, the power source supplying circuits 230 and 250 may supply the power source in common to the plurality of readout circuits RD0 to RDy included in the readout region 220. The power source supplying circuit 230 may be disposed closest to the first readout circuit RD0 among the plurality of readout circuits RD0 to RDy, and the power source supplying circuit 250 may be disposed closest to the $(y+1)^{th}$ readout circuit RDy among the plurality of readout circuits RD0 to RDy.

Figure 7:
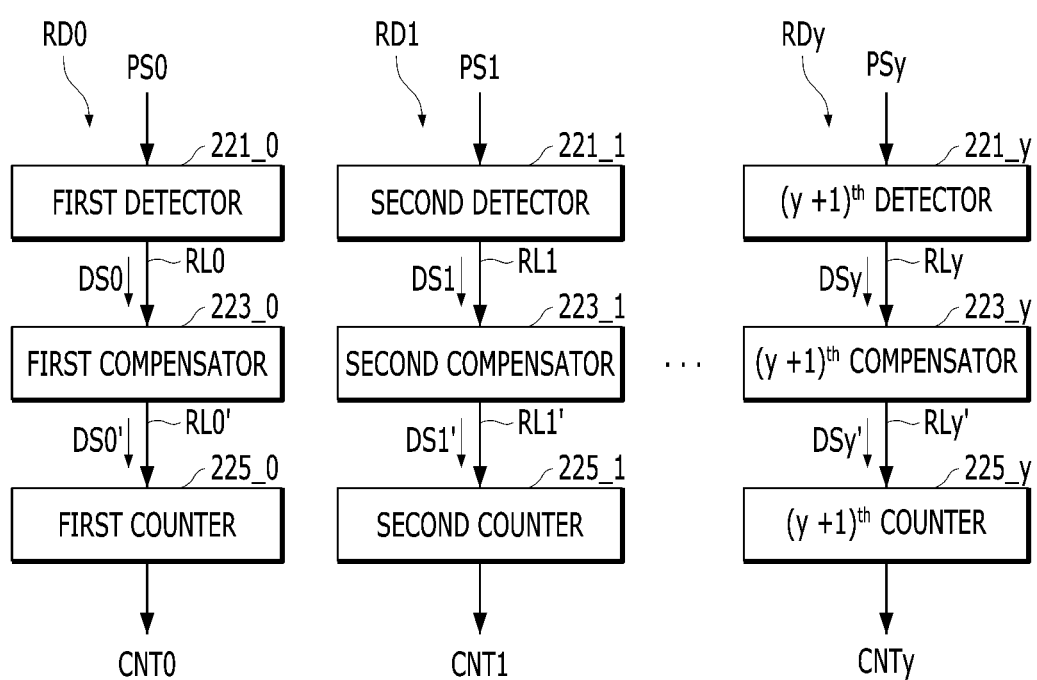
FIG. 7 is a block diagram illustrating a plurality of readout circuits of the image sensing device of FIG. 6 in accordance with various embodiments of the present invention.

FIG. 7 is a block diagram illustrating the plurality of readout circuits RD0 to RDy of FIG. 6 in accordance with various embodiments of the present invention.

Referring to FIG. 7, the first readout circuit RD0 may include a first detector 221_0, a first compensator 223_0 and a first counter 225_0.

The first detector 221_0 may be coupled to the first column line CL0. The first detector 221_0 may receive the first pixel signal PS0 through the first column line CL0, and output a first detection signal DS0, corresponding to a voltage level of the first pixel signal PS0, to the first readout line RL0 (hereinafter referred to as a "first initial readout line").

The first compensator 223_0 may be coupled to the first initial readout line RL0. The first compensator 223_0 may apply the predetermined resistance value in the first initial readout line RL0. For example, the first detection signal DS0 on the first readout line RL0 has a readout time delay when detected by the first detector 221_0. An amount of the readout time delay of the first detection signal DS0 may different from an amount of readout time delay of each of the second to the $(y+1)^{th}$ detection signal DSy on the second to the $(y+1)^{th}$ readout lines RL0 to RLy. For inverse compensation according to various embodiments of the present invention, the first compensator 223_0 may adjust the readout time delay of the first detection signal DS0 so that the difference between the readout time delay of the first detection signal DS0 and the readout time delays of the second to the $(y+1)^{th}$ detection signal DSy may be increased by applying the predetermined resistance value in the first initial readout line RL0 using a load (not shown) having the predetermined resistance value as the first compensator 223_0 (as described in more detail below in FIGS. 8 to 10). The first compensator 223_0 may output the inversely compensated first detection signal DS0 as a delayed first detection signal DS0' to a first readout line RL0' (hereinafter referred to as a "first last readout line").

The first counter 225_0 may be coupled to the first last readout line RL0'. The first counter 225_0 may count the delayed first detection signal DS0', and output the first count signal CNT0.

Since the second to $(y+1)^{th}$ readout circuits RD1 to RDy may be configured similarly to the first readout circuit RD0, descriptions thereof will be omitted for clarity. However, a resistance value set in at least one of second to $(y+1)^{th}$ compensators 223_1 to 223_y may be different from the resistance value set in the first compensator 223_0. That is, the plurality of compensators 223_0 to 223_y included in the plurality of readout circuits RD0 to RDy may apply different resistance values in two or more of the plurality of readout lines RL0 to RLy.

Figure 8A:
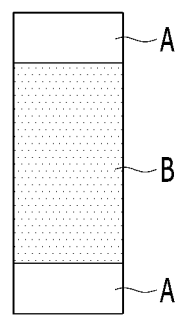
FIGS. 8A and 8B illustrate examples of a first compensator of the plurality of readout circuits of FIG. 7 in accordance with various embodiments of the present invention.
Figure 8B:

FIGS. 8A and 8B illustrate examples of the first compensator 223_0 of FIG. 7 in accordance with various embodiments of the present invention.

Referring to FIG. 8A, the first compensator 223_0 may include a first load. The first load may be a non-salicide poly resistor. The non-salicide poly resistor may include a salicide region A and a non-salicide region B. The salicide region A may have a relatively small resistance value, and the non-salicide region B may have a relatively large resistance value. A resistance value of the non-salicide poly resistor may be set by adjusting the size of each of the salicide and non-salicide regions A and B. For example, as the size of the non-salicide region B increases, the resistance value of the non-salicide poly resistor may increase, and as the size of the non-salicide region B decreases, the resistance value of the non-salicide poly resistor may decrease.

Each of the second to $(y+1)^{th}$ compensators 223_1 to 223_y may include the non-salicide poly resistor similar to the first compensator 223_0. However, the size of a non-salicide region included in at least one of the second to $(y+1)^{th}$ compensators 223_1 to 223_y may be different from the size of the non-salicide region B included in the first compensator 223_0.

Subsequently, referring to FIG. 8B, the first compensator 223_0 may include a second load. The second load may be a metal resistor. The metal resistor may include a metal line. A resistance value of the metal resistor may be set by adjusting the length of the metal line. For example, as the length of the metal line increases, the resistance value of the metal resistor may increase, and as the length of the metal line decreases, the resistance value of the metal resistor may decrease.

Each of the second to $(y+1)^{th}$ compensators 223_1 to 223_y may include the metal resistor similar to the first compensator 223_0. However, the length of a metal line included in at least one of the second to $(y+1)^{th}$ compensators 223_1 to 223_y may be different from the length of the metal line included in the first compensator 223_0.

Hereinafter, an operation of the image sensing device 200 having the above-described configuration according to various embodiments of the present invention will be described with reference to FIGS. 9, 10A and 10B.

Figure 9:
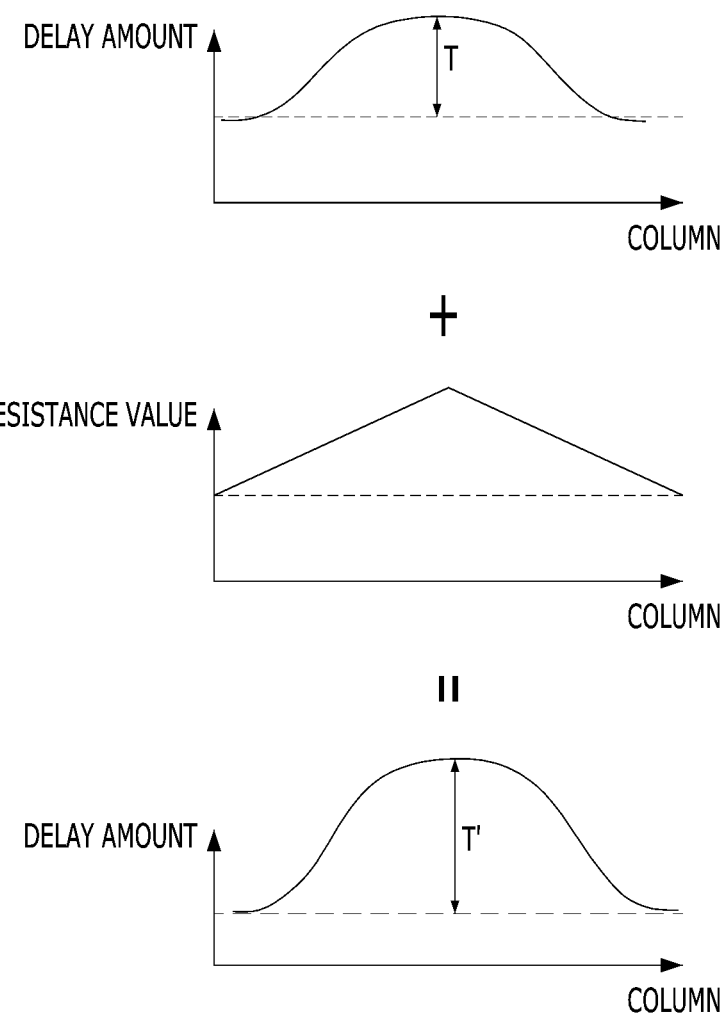
FIG. 9 is a graph showing an inverse compensation operation of the image sensing device of FIG. 6 in accordance with various embodiments of the present invention.

FIG. 9 is a graph showing an operation of the image sensing device 200 of FIG. 6 in accordance with various embodiments of the present invention.

Referring to FIG. 9, readout deviations T may occur among the plurality of pixel signals PS0 to PSy. Specifically, the readout deviations T may occur among a plurality of detection signals DS0 to DSy. In FIG. 9 the graph representing the readout deviations T is illustrated in a convex shape in the center of the column-axis, since the power source supplying circuits 230 and 250 for supplying the power source in common to the plurality of readout circuits RD0 to RDy are disposed closest to the first readout circuit RD0 and the $(y+1)^{th}$ readout circuit RDy. Accordingly, the plurality of detection signals DS0 to DSy may be outputted with different readout time delays according to the different distances from the power source supplying circuits to the respective readout circuits, so that the readout deviations T may occur among the plurality of detection signals DS0 to DSy.

The respective resistance values suitable to achieve the inverse compensation may be preset in the plurality of compensators 223_0 to 223_y according to the readout deviations T. For example, resistance values set in the compensators 223_0 to 223_y may be larger when the distances between the respective readout circuits and the power source supplying circuits increase, and resistance values set in the compensators 223_0 to 223_y may be smaller when the distances between the respective readout circuits and the power source supplying circuits decrease. The plurality of compensators 223_0 to 223_y may inversely compensate for the readout deviations T among the plurality of detection signals DS0 to DSy by applying the respective resistance values in the plurality of readout lines RL0 to RLy, based on the distances among the respective readout circuits and the power source supplying circuits. Accordingly, the difference in the readout time delays among a plurality of delayed detection signals DS0' to DSy' outputted from the plurality of compensators 223_0 to 223_y may be further increased. In other words, the readout deviations T' among the plurality of delayed detection signals DS0' to DSy' may be increased more than the readout deviations T among the plurality of detection signals DS0 to DSy.

A plurality of counters 225_0 to 225_y may output the plurality of count signals CNT0 to CNTy corresponding to the plurality of delayed detection signals DS0' to DSy', respectively. When the plurality of counters 225_0 to 225_y operate at similar timings, peak noise due to the plurality of counters 225_0 to 225_y may occur. However, since the readout deviations T' are present among the plurality of delayed detection signals DS0' to DSy', the peak noise due to the plurality of counters 225_0 to 225_y may be dispersed.

Figure 10A:
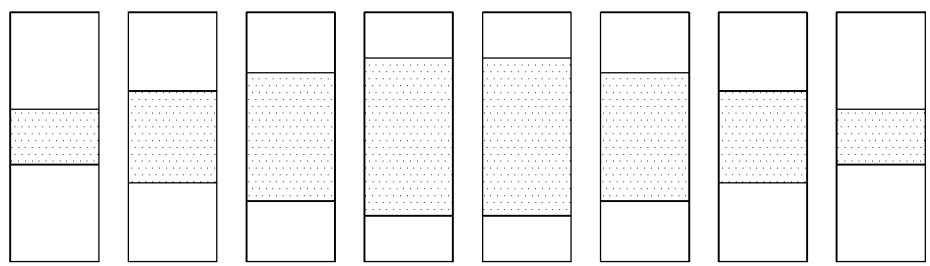
FIGS. 10A and 10B illustrate various implementations of the first compensator of FIGS. 8A and 8B in accordance with various embodiments of the present invention.
Figure 10B:
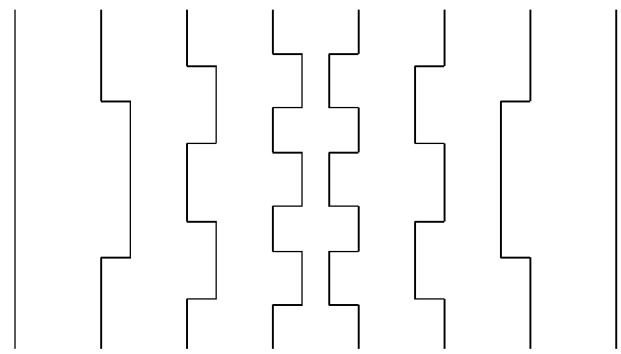

FIGS. 10A and 10B illustrate various implementations of the compensators 223_0 to 223_y of FIGS. 8A and 8B in accordance with various embodiments of the present invention. In FIGS. 10A and 10B, the compensators 223_0 to 223_y are illustrated as first to eighth compensators, i.e., y=7, for convenience in description.

Referring to FIGS. 10A and 10B, the fourth and fifth compensators disposed in the center of the first to eighth compensators may be set to have relatively large resistance values, and the first to third compensators and the sixth to eighth compensators may be set to have relatively small resistance values toward both ends thereof.

According to an embodiment, the readout deviations among the plurality of pixel signals may be inversely compensated for, thereby dispersing the peak noise due to the plurality of counters.

Figure 11:
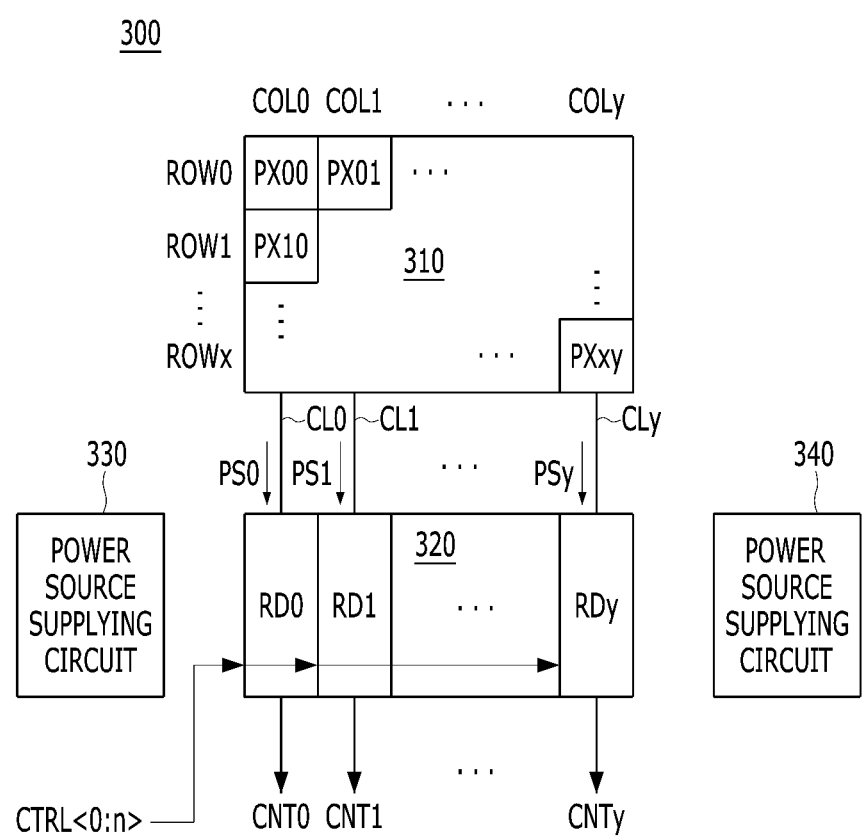
FIG. 11 is a block diagram illustrating an image sensing device in accordance with various embodiments of the present invention.

FIG. 11 is a block diagram illustrating an image sensing device 300 in accordance with various embodiments of the present invention.

Referring to FIG. 11, the image sensing device 300 may include a pixel region 310, a readout region 320 and power source supplying regions 330 and 340.

The pixel region 310 may include a pixel array. The pixel array may include a plurality of pixels PX00 to PXxy arranged along rows and columns (where x and y are natural numbers). For example, the plurality of pixels PX00 to PXxy may be arranged in first to $(x+1)^{th}$ rows ROW0 to ROWx and first to $(y+1)^{th}$ columns COL0 to COLy. The pixel array may output a plurality of pixel signals PS0 to PSy to a plurality of column lines CL0 to CLy. For example, the first to $(y+1)^{th}$ pixels PX00 to PX0y arranged in the first row ROW0 may output the first to $(y+1)^{th}$ pixel signals PS0 to PSy to the first to $(y+1)^{th}$ column lines CL0 to CLy during a first single row time period, and the first to $(y+1)^{th}$ pixels PXx0 to PXxy arranged in the $(x+1)^{th}$ row ROWx may output the first to $(y+1)^{th}$ pixel signals PS0 to PSy to the first to $(y+1)^{th}$ column lines CL0 to CLy during a $(x+1)^{th}$ single row time period.

The readout region 320 may include a plurality of readout circuits RD0 to RDy. The plurality of readout circuits RD0 to RDy may be coupled to the pixel array through the plurality of column lines CL0 to CLy, and read out the plurality of pixel signals PS0 to PSy. For example, the first to $(y+1)^{th}$ readout circuits RD0 to RDy may be coupled to the first to $(y+1)^{th}$ column lines CL0 to CLy, and read out the first to $(y+1)^{th}$ pixel signals PS0 to PSy, from the first to $(y+1)^{th}$ column lines CL0 to CLy, and then output the signals as first to $(y+1)^{th}$ count signals CNT0 to CNTy.

The plurality of readout circuits RD0 to RDy may compensate for readout deviations among the plurality of pixel signals PS0 to PSy based on a plurality of control signals CTRL<0:n> when reading out the pixel signals PS0 to PSy (where n is a natural number). For example, the plurality of readout circuits RD0 to RDy may compensate for the readout deviations among the plurality of the pixel signals PS0 to PSy by applying one of a plurality of predetermined resistance values in each path within the plurality of readout circuits RD0 to RDy, respectively, each path carrying out the corresponding pixel signal of the plurality of pixel signals PS0 to PSy, thereby compensating for the readout deviations among the plurality of pixel signals PS0 to PSy. In particular, each of the plurality of readout circuits RD0 to RDy may adjust the resistance values to be respectively applied in each path within the plurality of readout circuits RD0 to RDy, under the control of the control signals CTRL<0:n>, thereby determining one of the resistance values. In addition, each of the plurality of readout circuits RD0 to RDy may flexibly adjust the resistance values to be respectively applied in each path within the plurality of readout circuits RD0 to RDy, according to variations in the process, voltage, and temperature (PVT), under the control of the control signals CTRL<0:n>.

The compensation may include direct compensation and inverse compensation. The direct compensation refers to decreasing the readout deviations among the plurality of pixel signals PS0 to PSy. To this end, the resistance values, to be applied in each path within the plurality of readout circuits RD0 to RDy, may be set so that the readout deviations among the plurality of pixel signals PS0 to Psy can be decreased. The inverse compensation refers to increasing the readout deviations among the plurality of pixel signals PS0 to PSy. To this end, the resistance values, to be applied in each path within the plurality of readout circuits RD0 to RDy, may be set so that the readout deviations among the plurality of pixel signals PS0 to Psy can be increased.

The power source supplying regions 330 and 340 may include power source supplying circuits 330 and 340, respectively. The power source supplying circuits 330 and 340 may generate a power source necessary for the readout region 320, and supply the power source to the readout region 320. For example, the power source supplying circuits 330 and 340 may supply the power source in common to the plurality of readout circuits RD0 to RDy included in the readout region 320. The power source supplying circuit 330 may be disposed closest to the first readout circuit RD0 among the plurality of readout circuits RD0 to RDy, and the power source supplying circuit 340 may be disposed closest to the $(y+1)^{th}$ readout circuit RDy among the plurality of readout circuits RD0 to RDy.

Figure 12:
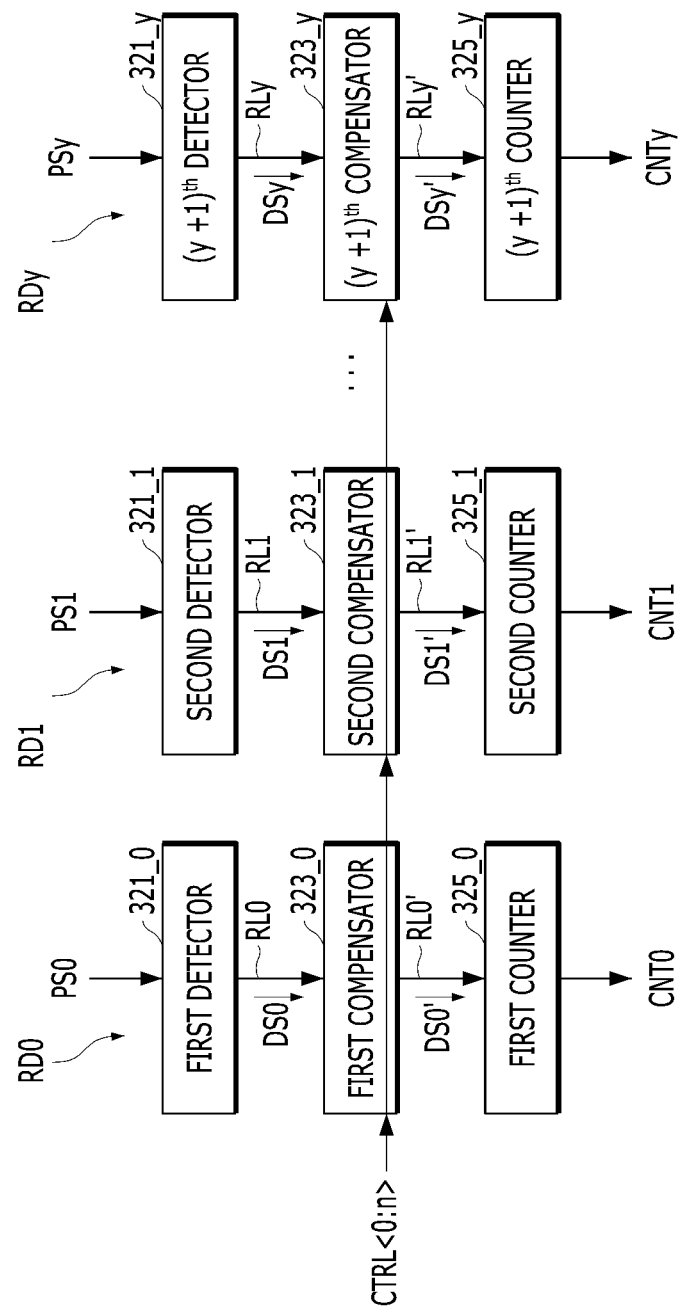
FIG. 12 is a block diagram illustrating a plurality of readout circuits of the image sensing device of FIG. 11 in accordance with various embodiments of the present invention.

FIG. 12 is a block diagram illustrating the plurality of readout circuits RD0 to RDy of FIG. 11 in accordance with various embodiments of the present invention.

Referring to FIG. 12, the first readout circuit RD0 may include a first detector 321_0, a first compensator 323_0 and a first counter 325_0.

The first detector 321_0 may be coupled to the first column line CL0. The first detector 321_0 may receive the first pixel signal PS0 through the first column line CL0, and output a first detection signal DS0, corresponding to a voltage level of the first pixel signal PS0, to the first readout line RL0 (hereinafter referred to as a "first initial readout line").

The first compensator 323_0 may be coupled to the first initial readout line RL0. The first compensator 323_0 may selectively apply one of a plurality of resistance values in the first initial readout line RL0, under the control of the plurality of control signals CTRL<0:n>. For direct compensation according to various embodiments of the present invention, the first compensator 323_0 may adjust the readout time delay of the first detection signal DS0 so that the difference between the readout time delay of the first detection signal DS0 and the readout time delays of the second to the $(y+1)^{th}$ detection signal DSy may be decreased by applying one of a plurality of first resistance values in the first initial readout line RL0 using a plurality of loads (not shown) each having one of a plurality of first resistance values, under the control of the control signals CTRL<0:n> (as described in more detail below in FIGS. 13 to 15). For inverse compensation according to various embodiments of the present invention, the first compensator 323_0 may adjust the readout time delay of the first detection signal DS0 so that the difference between the readout time delay of the first detection signal DS0 and the readout time delays of the second to the $(y+1)^{th}$ detection signal DSy may be increased by applying one of a plurality of second resistance values in the first initial readout line RL0 using a plurality of load (not shown) each having one of the plurality of second resistance values under the control of the control signals CTRL<0:n> (as described in more detail below in FIGS. 13, 14 and 16). The first compensator 323_0 may output the directly compensated or inversely compensated first detection signal DS0 as a delayed first detection signal DS0' to a first readout line RL0' (hereinafter referred to as a "first last readout line").

The first counter 325_0 may be coupled to the first last readout line RL0'. The first counter 325_0 may count the delayed first detection signal DS0', and output the first count signal CNT0.

Since the second to $(y+1)^{th}$ readout circuits RD1 to RDy may be configured similar to the first readout circuit RD0, descriptions thereof will be omitted for clarity. However, a plurality of resistance values set in at least one of second to $(y+1)^{th}$ compensators 123_1 to 123_y may be different from the plurality of resistance values set in the first compensator 323_0.

Figure 13:
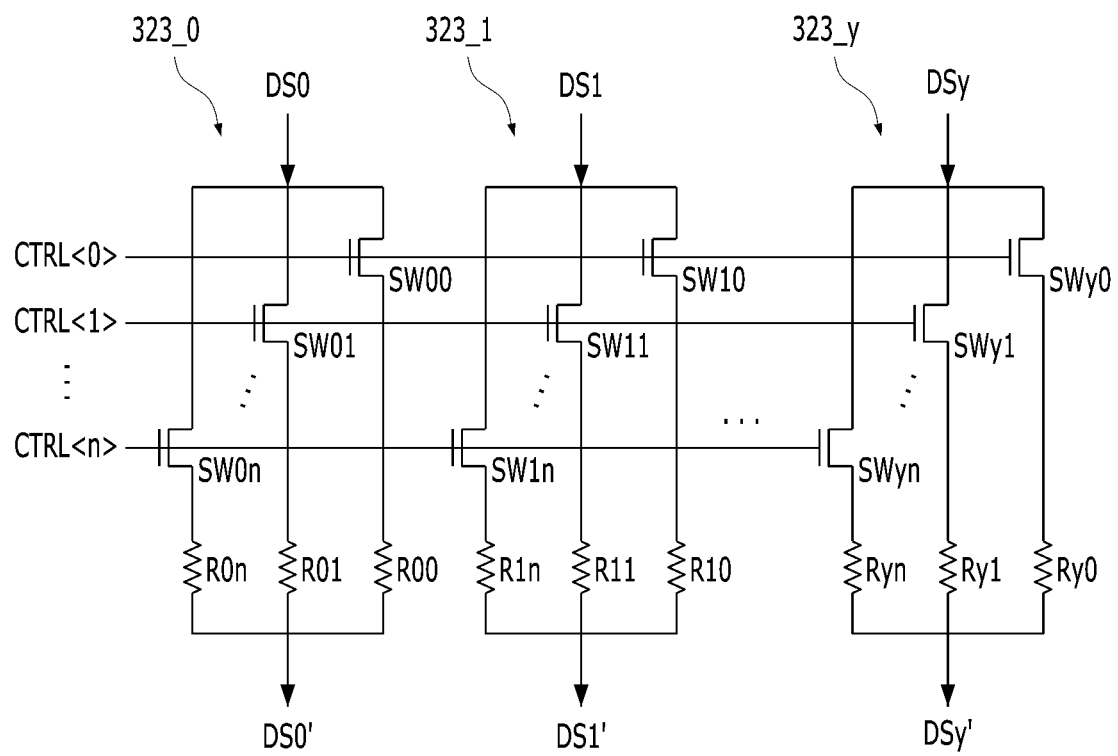
FIG. 13 is a circuit diagram illustrating a plurality of compensators of the plurality of the readout circuits of FIG. 12 in accordance with various embodiments of the present invention.

FIG. 13 is a circuit diagram illustrating the first to $(y+1)^{th}$ compensators 323_0 to 323_y of FIG. 12 in accordance with various embodiments of the present invention.

Referring to FIG. 13, the first compensator 323_0 may include a plurality of first switches SW00 to SW0n and a plurality of first loads R00 to R0n.

The plurality of first switches SW00 to SW0n may be coupled in parallel between the first initial readout line RL0 to which the first detection signal DS0 is inputted and the plurality of first loads R00 to R0n. The plurality of first switches SW00 to SW0n may couple one or more of the first loads R00 to R0n to the first initial readout line RL0, under the control of the plurality of control signals CTRL<0:n>.

The plurality of first loads R00 to R0n may be coupled in parallel between the first last readout line RL0' to which the first detection signal DS0' is outputted and the plurality of first switches SW00 to SW0n. The plurality of first loads R00 to R0n may have the same resistance value.

The first compensator 323_0 having the above-described configuration may have one of the plurality of resistance values according to the combination of the plurality of first loads R00 to R0n determined by the plurality of first switches SW00 to SW0n.

Since the second to $(y+1)^{th}$ compensators 323_1 to 323_y may be configured similar to the first compensator 323_0, descriptions thereof will be omitted for clarity. However, a plurality of resistance values set in at least one of the second to $(y+1)^{th}$ compensators 323_1 to 323_y may be different from the plurality of resistance values set in the first compensator 323_0. For example, a plurality of second loads R10 to R1n included in the second compensator 323_1 have the same resistance value, but may have different resistance values from the plurality of first loads R00 to R0n included in the first compensator 323_0.

Figure 14A:
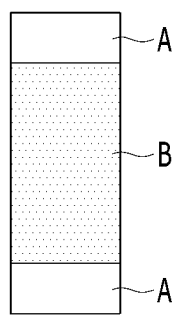
FIGS. 14A and 14B illustrate examples of a first load of the plurality of compensators of FIG. 13 in accordance with various embodiments of the present invention.
Figure 14B:

FIGS. 14A and 14B illustrate examples of the first load R00 among the plurality of first loads R00 to R0n of FIG. 13 in accordance with various embodiments of the present invention.

Referring to FIG. 14A, the first load R00 may be a non-salicide poly resistor. The non-salicide poly resistor may include a salicide region A and a non-salicide region B. The salicide region A may have a relatively small resistance value, and the non-salicide region B may have a relatively large resistance value. A resistance value of the non-salicide poly resistor may be set by adjusting the size of each of the salicide and non-salicide regions A and B. For example, as the size of the non-salicide region B increases, the resistance value of the non-salicide poly resistor may increase, and as the size of the non-salicide region B decreases, the resistance value of the non-salicide poly resistor may decrease.

Each of first loads R01 and R0n of the plurality of first loads R00 to R0n may include the non-salicide poly resistor in the same manner as the first load R00. Since the plurality of first loads R00 to R0n have the same resistance value, the salicide region A and the non-salicide region B may be designed to be the same size as each other.

Respective loads included in the second to $(y+1)^{th}$ compensators 323_1 to 323_y may include the non-salicide poly resistor in the same manner as the first load R00. However, since a plurality of loads included in at least one of the second to $(y+1)^{th}$ compensators 323_1 to 323_y have different resistance values from the first load R00, the silicide region A and the non-salicide region B of each of the plurality of loads included in at least one of the second to $(y+1)^{th}$ compensators 323_1 to 323_y may be designed to be different sizes from those of the first load R00. For example, the silicide region A and the non-salicide region B of each of the plurality of second loads R10 to R1n included in the second compensator 323_1 may be designed to be different sizes from those of the first load R00.

Subsequently, referring to FIG. 14B, the first load R00 may be a metal resistor. The metal resistor may include a metal line. A resistance value of the metal resistor may be set by adjusting the length of the metal line. For example, as the length of the metal line increases, the resistance value of the metal resistor may increase, and as the length of the metal line decreases, the resistance value of the metal resistor may decrease.

Each of first loads R01 and R0n of the plurality of first loads R00 to R0n may include the metal resistor in the same manner as the first load R00. Since the plurality of first loads R00 to R0n have the same resistance value, the metal lines included in the metal resistors of the first loads R01 and R0n may be designed to have the same length.

Each of the loads included in the second to $(y+1)^{th}$ compensators 323_1 to 323_y may include the metal resistor in the same manner as the first load R00. However, since the plurality of loads included in at least one of the second to $(y+1)^{th}$ compensators 323_1 to 323_y have different resistance values from the first load R00, metal lines of the plurality of loads included in at least one of the second to $(y+1)^{th}$ compensators 323_1 to 323_y may be designed to have different lengths from the metal line of the first load R00. For example, metal lines of the plurality of second loads R10 to R1n included in the second compensator 323_1 may be designed to have different lengths from the metal line of the first load R00.

Hereinafter, an operation of the image sensing device 300 having the above-described configuration according to various embodiments of the present invention will be described with reference to FIGS. 15 and 16.

Figure 15:
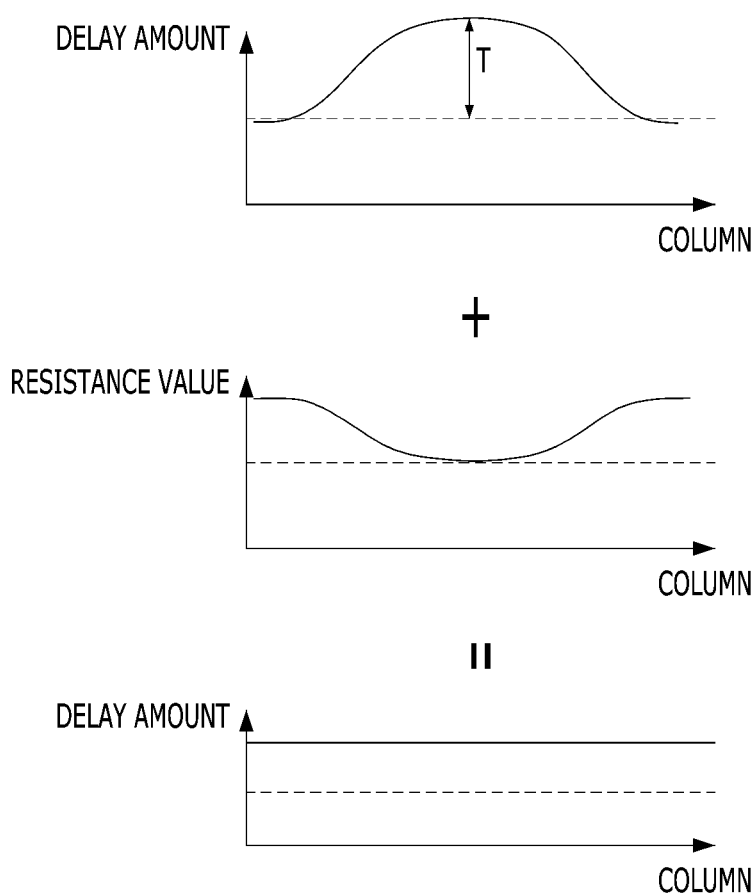
FIG. 15 is a graph showing a direct compensation operation of the image sensing device of FIG. 11 in accordance with various embodiments of the present invention.

FIG. 15 is a graph showing a direct compensation operation of the image sensing device 300 of FIG. 11 in accordance with various embodiments of the present invention.

Referring to FIG. 15, readout deviations T may occur among the plurality of pixel signals PS0 to PSy. Specifically, the readout deviations T may occur among a plurality of detection signals DS0 to DSy. In FIG. 15, the graph representing the readout deviations T is illustrated in a convex shape in the center of the column-axis, since the power source supplying circuits 330 and 340 for supplying the power source in common to the plurality of readout circuits RD0 to RDy are disposed closest to the first readout circuit RD0 and the $(y+1)^{th}$ readout circuit RDy, respectively. Accordingly, the plurality of detection signals DS0 to DSy may be outputted with different readout time delays according to the different distances from the power source supplying circuits to the respective readout circuits, so that the readout deviations T may occur among the plurality of detection signals DS0 to DSy.

The respective resistance values suitable to achieve the direct compensation may be preset in the plurality of compensators 323_0 to 323_y according to the readout deviations T. For example, the resistance values set in the compensators 323_0 to 323_y may be larger when the distances between the respective readout circuits and the power source supplying circuits decrease, and the resistance values set in the compensators 323_0 to 323_y may be smaller when the distances between the respective readout circuits and the power source supplying circuits increase. The plurality of compensators 323_0 to 323_y may finely adjust the respective resistance values under the control of the plurality of control signals CTRL<0:n>. The plurality of compensators 323_0 to 323_y may directly compensate for the readout deviations T among the plurality of detection signals DS0 to DSy by applying the respective resistance values in the plurality of readout lines RL0 to RLy based on the distances among the respective readout circuits and the power source supplying circuits. For example, the plurality of compensators 323_0 to 323_y may decrease the readout deviations T among the plurality of detection signals DS0 to DSy for the direct compensation of the readout deviations T. Accordingly, the plurality of delayed detection signals DS0' to DSy' outputted from the plurality of compensators 323_0 to 323_y may have the same readout time delays.

A plurality of counters 325_0 to 325_y may output the plurality of count signals CNT0 to CNTy corresponding to the plurality of delayed detection signals DS0' to DSy', respectively.

Figure 16:
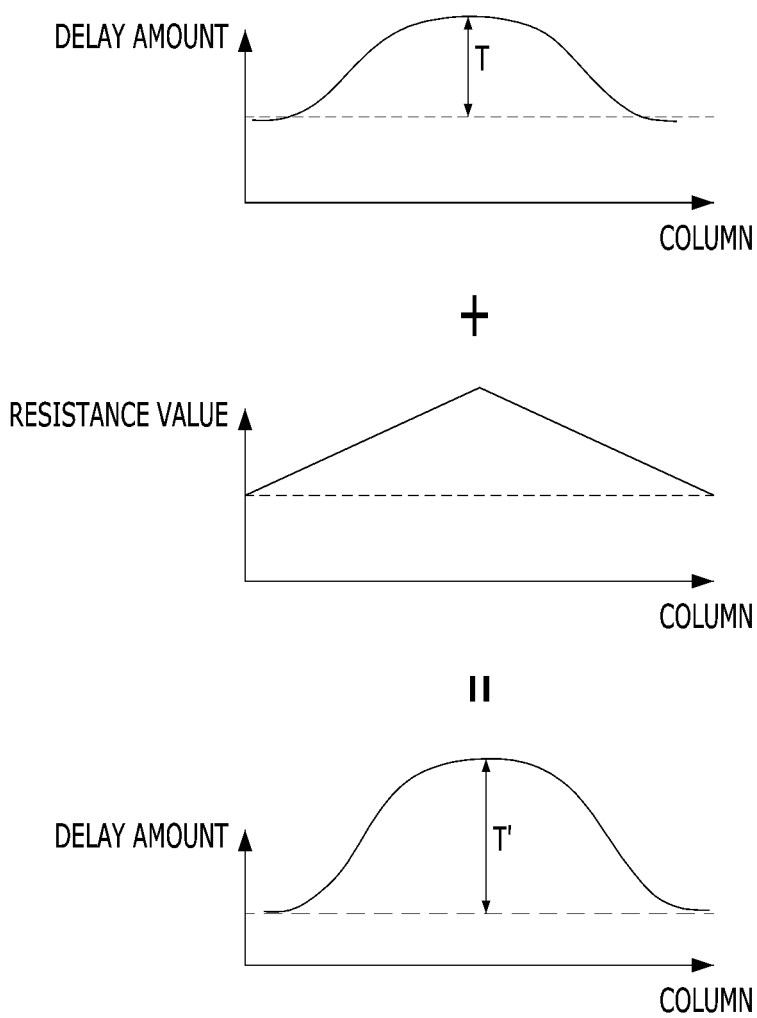
FIG. 16 is a graph showing an inverse compensation operation of the image sensing device of FIG. 11 in accordance with various embodiments of the present invention.

FIG. 16 is a graph showing an inverse compensation operation of the image sensing device 300 of FIG. 11 in accordance with some embodiments of the present invention.

Referring to FIG. 16, readout deviations T may occur among the plurality of pixel signals PS0 to PSy. Specifically, the readout deviations T may occur among a plurality of detection signals DS0 to DSy. In FIG. 16, the graph representing the readout deviations T is illustrated in a convex shape in the center of the column-axis, since the power source supplying circuits 330 and 340 for supplying the power source in common to the plurality of readout circuits RD0 to RDy are disposed closest to the first readout circuit RD0 and the $(y+1)^{th}$ readout circuit RDy, respectively. Accordingly, the plurality of detection signals DS0 to DSy may be outputted with different readout time delays according to the different distances from the power source supplying circuits to respective readout circuits, so that the readout deviations T may occur among the plurality of detection signals DS0 to DSy.

The respective resistance values suitable to achieve the inverse compensation may be preset in the plurality of compensators 323_0 to 323_y according to the readout deviations T. For example, resistance values set in the compensators may be larger when the distances between the respective readout circuits and the power source supplying circuits increase, and resistance values set in the compensators 323_0 to 323_y may be smaller when the distances between the respective readout circuits and the power source supplying circuits decrease. The plurality of compensators 323_0 to 323_y may finely adjust the respective resistance values, under the control of the plurality of control signals CTRL<0:n>. The plurality of compensators 323_0 to 323_y may inversely compensate for the readout deviations T among the plurality of detection signals DS0 to DSy by applying the respective predetermined resistance values in the plurality of readout lines RL0 to RLy based on the distances among the respective readout circuits and the power source supplying circuits. Accordingly, the difference in the readout time delays among a plurality of delayed detection signals DS0' to DSy' outputted from the plurality of compensators 323_0 to 323_y may be further increased. In other words, the readout deviations T' among the plurality of delayed detection signals DS0' to DSy' may be increased more than the readout deviations T among the plurality of detection signals DS0 to DSy.

The plurality of counters 325_0 to 325_y may output the plurality of count signals CNT0 to CNTy corresponding to the plurality of delayed detection signals DS0' to DSy', respectively. When the plurality of counters 325_0 to 325_y operate at similar timings, peak noise due to the plurality of counters 325_0 to 325_y may occur. However, since the readout deviations T' are present among the plurality of delayed detection signals DS0' to DSy', the peak noise due to the plurality of counters 325_0 to 325_y may be dispersed.

According to various embodiments of the present invention, the resistance values necessary for compensating for the readout deviations among the plurality of pixel signals may be finely adjusted, and further, the resistance values may be adjusted according to variations in the process, voltage, and temperature (PVT). In addition, the readout deviations among the plurality of pixel signals may be alleviated by directly compensating for the readout deviations among the plurality of pixel signals, or the peak noise due to the plurality of counters may be dispersed by inversely compensating for the readout deviations among the plurality of pixel signals.

Figure 17:
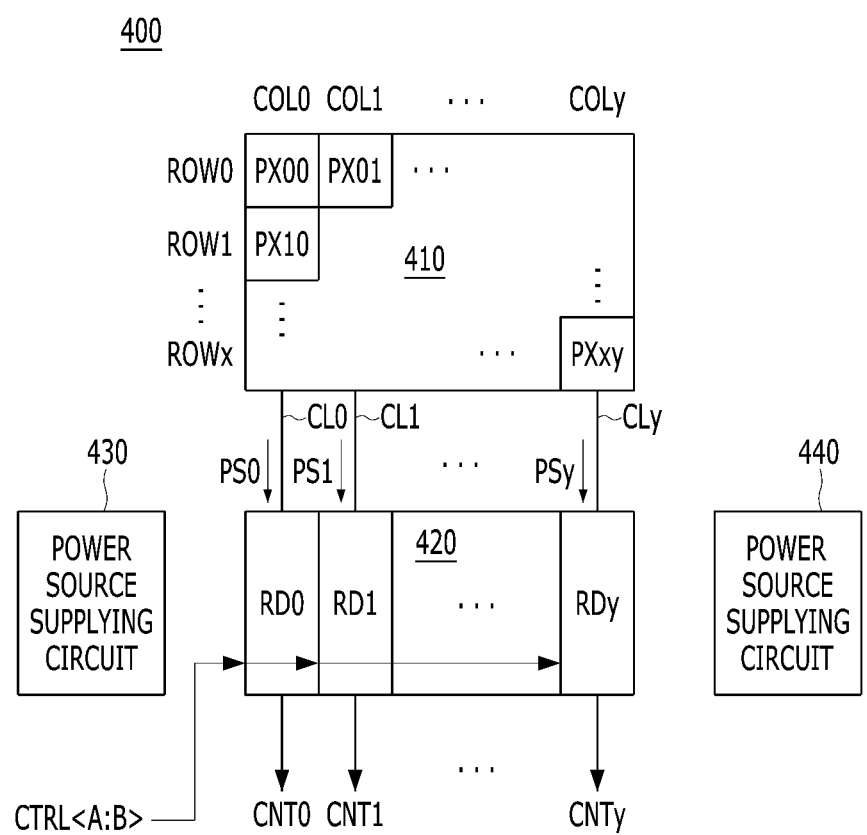
FIG. 17 is a block diagram illustrating an image sensing device in accordance with various embodiments of the present invention.

FIG. 17 is a block diagram illustrating an image sensing device 400 in accordance with various embodiments of the present invention.

Referring to FIG. 17, the image sensing device 400 may include a pixel region 410, a readout region 420 and power source supplying regions 430 and 440.

The pixel region 410 may include a pixel array. The pixel array may include a plurality of pixels PX00 to PXxy arranged along rows and columns (where x and y are natural numbers). For example, the plurality of pixels PX00 to PXxy may be arranged in first to $(x+1)^{th}$ rows ROW0 to ROWx and first to $(y+1)^{th}$ columns COL0 to COLy. The pixel array may output a plurality of pixel signals PS0 to PSy to a plurality of column lines CL0 to CLy. For example, the first to $(y+1)^{th}$ pixels PX00 to PX0y arranged in the first row ROW0 may output the first to $(y+1)^{th}$ pixel signals PS0 to PSy to the first to $(y+1)^{th}$ column lines CL0 to CLy during a first single row time period, and the first to $(y+1)^{th}$ pixels PXx0 to PXxy arranged in the $(x+1)^{th}$ row ROWx may output the first to $(y+1)^{th}$ pixel signals PS0 to PSy to the first to $(y+1)^{th}$ column lines CL0 to CLy during a $(x+1)^{th}$ single row time period.

The readout region 420 may include a plurality of readout circuits RD0 to RDy. The plurality of readout circuits RD0 to RDy may be coupled to the pixel array through the plurality of column lines CL0 to CLy, and may read out the plurality of pixel signals PS0 to PSy. For example, the first to $(y+1)^{th}$ readout circuits RD0 to RDy may be coupled to the first to $(y+1)^{th}$ column lines CL0 to CLy, and read out the first to $(y+1)^{th}$ pixel signals PS0 to PSy, from the first to $(y+1)^{th}$ column lines CL0 to CLy, and then output the signals as first to $(y+1)^{th}$ count signals CNT0 to CNTy.

The plurality of readout circuits RD0 to RDy may compensate for readout deviations among the plurality of pixel signals PS0 to PSy under the control of first and second control signals CTRL<A:B> when reading out the pixel signals PS0 to PSy. For example, the plurality of readout circuits RD0 to RDy may compensate for the readout deviations among the plurality of the pixel signals PS0 to PSy by applying one of predetermined first and second resistance values in each path within the plurality of readout circuits RD0 to RDy, each path carrying out the corresponding pixel signal of the plurality of pixel signals PS0 to PSy, thereby compensating for the readout deviations among the plurality of pixel signals PS0 to PSy. The compensation for the readout deviations may include direct compensation and inverse compensation. The direct compensation refers to decreasing the readout deviations among the plurality of pixel signals PS0 to PSy. To this end, the first resistance value to be applied in each path within the plurality of readout circuits RD0 to RDy may be set so that the readout deviations among the plurality of pixel signals PS0 to PSy can be decreased. The inverse compensation refers to increasing the readout deviations among the plurality of pixel signals PS0 to PSy. To this end, the second resistance value to be applied in each path within the plurality of readout circuits RD0 to RDy may be set so that the readout deviations among the plurality of pixel signals PS0 to PSy can be increased.

The power source supplying regions 430 and 440 may include power source supplying circuits 430 and 440, respectively. The power source supplying circuits 430 and 440 may generate a power source necessary for the readout region 420, and supply the power source to the readout region 420. For example, the power source supplying circuits 430 and 440 may supply the power source in common to the plurality of readout circuits RD0 to RDy included in the readout region 420. The power source supplying circuit 430 may be disposed closest to the first readout circuit RD0 among the plurality of readout circuits RD0 to RDy, and the power source supplying circuit 440 may be disposed closest to the $(y+1)^{th}$ readout circuit RDy among the plurality of readout circuits RD0 to RDy.

Figure 18:
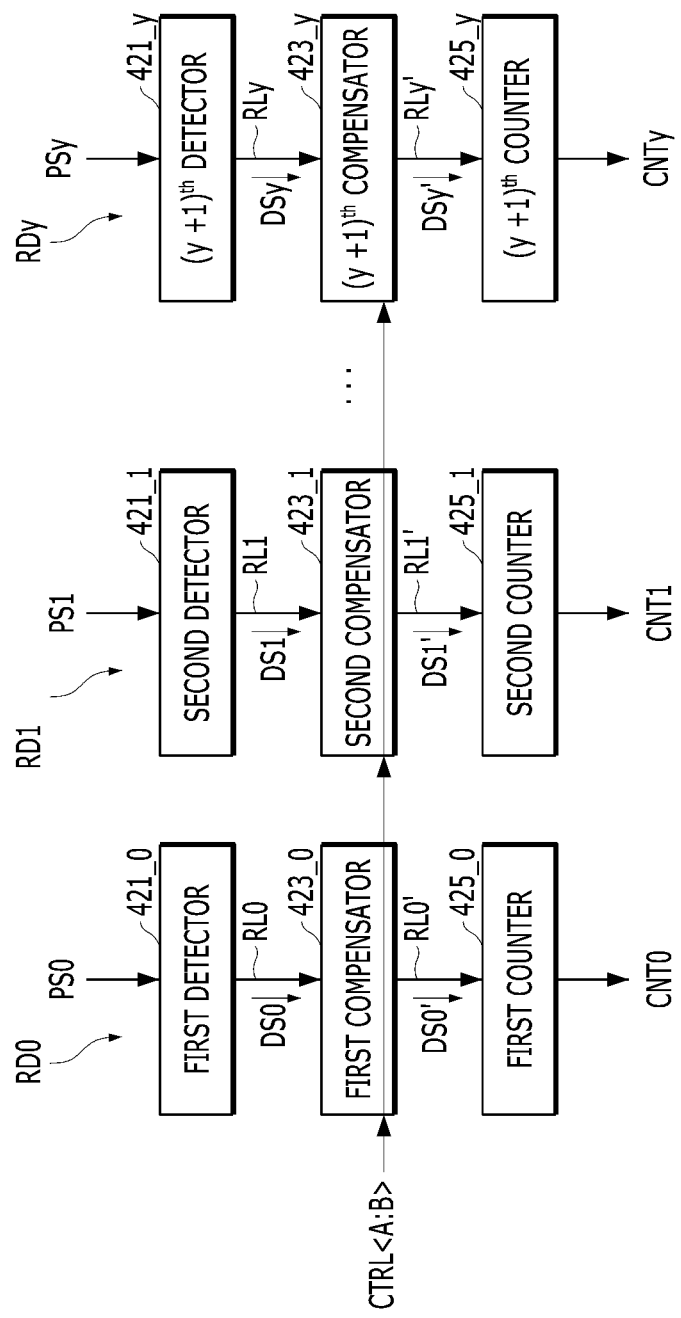
FIG. 18 is a block diagram illustrating a plurality of readout circuits of the image sensing device of FIG. 17 in accordance with various embodiments of the present invention.

FIG. 18 is a block diagram illustrating the plurality of readout circuits RD0 to RDy of FIG. 17 in accordance with various embodiments of the present invention.

Referring to FIG. 18, the first readout circuit RD0 may include a first detector 421_0, a first compensator 423_0 and a first counter 425_0.

The first detector 421_0 may be coupled to the first column line CL0. The first detector 421_0 may receive the first pixel signal PS0 through the first column line CL0, and output a first detection signal DS0, corresponding to a voltage level of the first pixel signal PS0, to the first readout line RL0 (hereinafter referred to as a "first initial readout line").

The first compensator 423_0 may be coupled to the first initial readout line RL0. The first compensator 423_0 may apply one of the predetermined first and second resistance values in the first initial readout line RL0 under the control of the first and second control signals CTRL<A:B>. For direct compensation, when the first control signal CTRL<A> of the first and second control signals CTRL<A:B> is activated, the first compensator 423_0 may apply the first resistance value of the first and second resistance values in the first initial readout line RL0 under the control of the activated first control signal CTRL<A>. On the other hand, for inverse compensation, when the second control signal CTRL<B> of the first and second control signals CTRL<A:B> is activated, the first compensator 423_0 may apply the second resistance value of the first and second resistance values in the first initial readout line RL0 under the control of the activated second control signal CTRL<B>. The first compensator 423_0 may output the directly compensated or inversely compensated first detection signal DS0 as a delayed first detection signal DS0' to a first readout line RL0' (hereinafter referred to as a "first last readout line").

The first counter 425_0 may be coupled to the first last readout line RL0'. The first counter 425_0 may count the delayed first detection signal DS0', and output the first count signal CNT0.

Since the second to $(y+1)^{th}$ readout circuits RD1 to RDy may be configured similarly to the first readout circuit RD0, descriptions thereof will be omitted for clarity. However, first and second resistance values set in at least one of second to $(y+1)^{th}$ compensators 423_1 to 423_y may be different from the first and second resistance values set in the first compensator 423_0.

Figure 19:
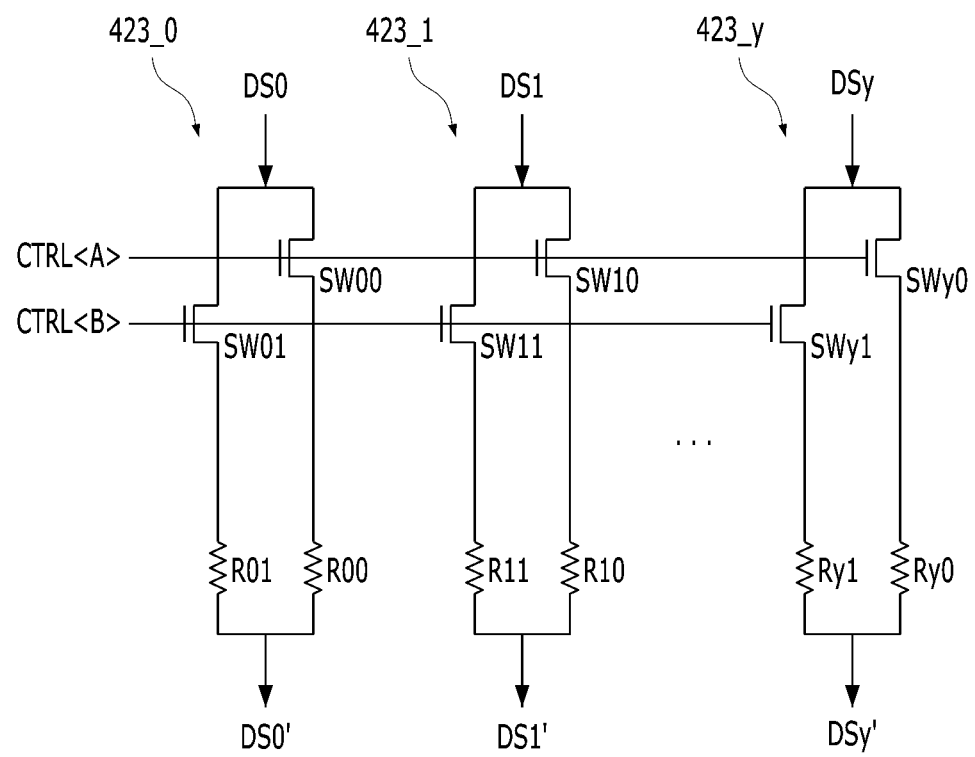
FIG. 19 is a circuit diagram illustrating a plurality of compensators of the plurality of the readout circuits of FIG. 18 in accordance with various embodiments of the present invention.

FIG. 19 is a circuit diagram illustrating the first to $(y+1)^{th}$ compensators 423_0 to 423_y of FIG. 18 in accordance with various embodiments of the present invention.

Referring to FIG. 19, the first compensator 423_0 may include a first switch SW00, a second switch SW01, a first load R00 and a second load R01.

The first switch SW00 may be coupled between the first initial readout line RL0 to which the first detection signal DS0 is inputted and the first load R00. The first switch SW00 may selectively couple the first initial readout line RL0 to the first load R00 under the control of the first control signal CTRL<A>.

The second switch SW01 may be coupled between the first initial readout line RL0 to which the first detection signal DS0 is inputted and the second load R01. The second switch SW01 may selectively couple the first initial readout line RL0 to the second load R01 under the control of the second control signal CTRL<B>.

The first load R00 may be coupled between the first last readout line RL0' to which the delayed first detection signal DS0' is outputted and the first switch SW00. The first load R00 may have the first resistance value for the direct compensation.

The second load R01 may be coupled between the first last readout line RL0' to which the delayed first detection signal DS0' is outputted and the second switch SW01. The second load R01 may have the second resistance value for the inverse compensation. The second resistance value may be different from the first resistance value.

Since the second to $(y+1)^{th}$ compensators 423_1 to 423_y may be configured similarly to the first compensator 423_0, descriptions thereof will be omitted for clarity. However, first and second resistance values set in at least one of the second to (y+1)$^{th}$ compensators 423_1 to 423_y may be different from the first and second resistance values set in the first compensator 423_0.

Figure 20A:
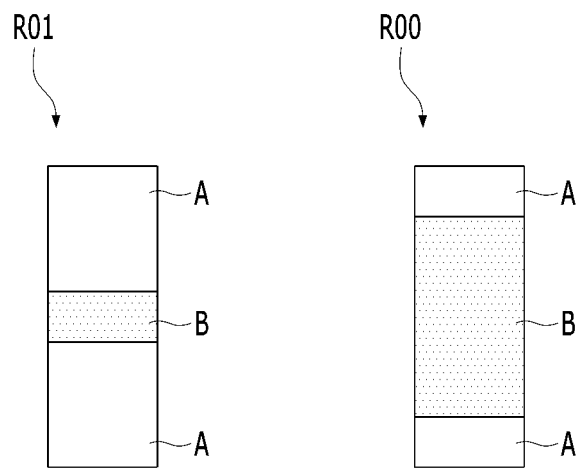
FIGS. 20A and 20B illustrate examples of first and second loads of the plurality of compensators of FIG. 19 in accordance with various embodiments of the present invention.
Figure 20B:
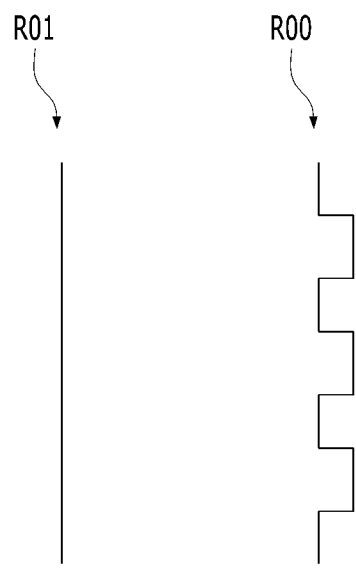

FIGS. 20A and 20B illustrate examples of the first and second loads R00 and R01 of FIG. 19 in accordance with various embodiments of the present invention.

Referring to FIG. 20A, each of the first and second loads R00 and R01 may be a non-salicide poly resistor. The non-salicide poly resistor may include a salicide region A and a non-salicide region B. The salicide region A may have a relatively small resistance value, and the non-salicide region B may have a relatively large resistance value. The resistance value of the non-salicide poly resistor may be set by adjusting the size of each of the salicide and non-salicide regions A and B. For example, as the size of the non-salicide region B increases, the resistance value of the non-salicide poly resistor may increase, and as the size of the non-salicide region B decreases, the resistance value of the non-salicide poly resistor may decrease.

First and second loads included in each of the second to (y+1)$^{th}$ compensators 423_1 to 423_y may include the non-salicide poly resistor in the same manner as the first and second loads R00 and R01, respectively. However, since each of the first and second loads included in at least one of the second to (y+1)$^{th}$ compensators 423_1 to 423_y has different resistance values from the first and second loads R00 and R01, the first and second loads included in at least one of the second to (y+1)$^{th}$ compensators 423_1 to 423_y may be designed to have different sizes from those of the first and second loads R01 and R01. For example, the salicide and non-salicide regions A and B of a first load R10 included in the second compensator 423_1 may be designed to have different sizes from those of the first load R00, and the salicide and non-salicide regions A and B of a second load R11 included in the second compensator 423_1 may be designed to have different sizes from those of the second load R01.

Referring to FIG. 20B, each of the first and second loads R00 and R01 may be a metal resistor. The metal resistor may include a metal line. The resistance value of the metal resistor may be set by adjusting the length of the metal line. For example, as the length of the metal line increases, the resistance value of the metal resistor may increase, and as the length of the metal line decreases, the resistance value of the metal resistor may decrease.

First and second loads included in each of the second to (y+1)$^{th}$ compensators 423_1 to 423_y may include the metal resistor in the same manner as the first and second loads R00 and R01, respectively. However, since each of the first and second loads included in at least one of the second to (y+1)$^{th}$ compensators 423_1 to 423_y has different resistance values from the first and second loads R00 and R01 included in the first compensator 423_0, the lengths of the metal lines of the first and second loads included in at least one of the second to (y+1)$^{th}$ compensators 423_1 to 423_y may be designed to have different lengths from those of the first and second loads R00 and R01 included in the first compensator 423_0. For example, the metal line of the first load R10 included in the second compensator 423_1 may be designed to have a different length from that of the first load R00 included in the first compensator 423_0, and the metal line of the second load R11 included in the second compensator 423_1 may be designed to have a different length from that of the second load R01 included in the first compensator 423_0.

Hereinafter, an operation of the image sensing device 400 having the above-described configuration according to various embodiments of the present invention will be described with reference to FIGS. 21 and 22.

Figure 21:
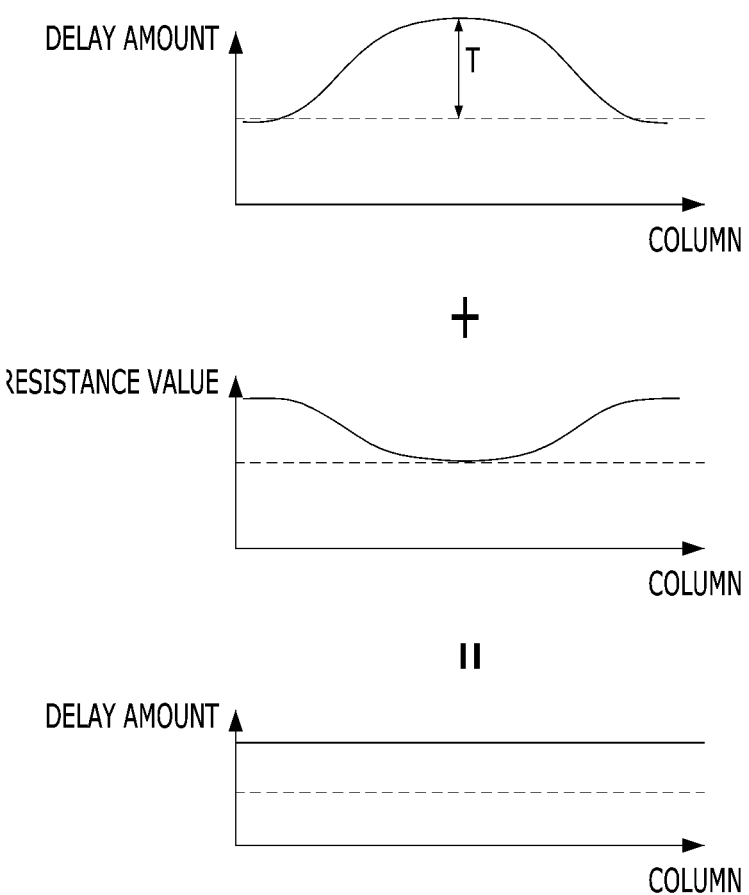
FIG. 21 is a graph showing a direct compensation operation of the image sensing device of FIG. 17 in accordance with various embodiments of the present invention.

FIG. 21 is a graph showing a direct compensation operation of the image sensing device 400 of FIG. 17 in accordance with various embodiments of the present invention.

Referring to FIG. 21, the operation related to the direct compensation may be performed when the first control signal CTRL<A> of the first and second control signals CTRL<A:B> is activated.

Readout deviations T may occur among the plurality of pixel signals PS0 to PSy. Specifically, the readout deviations T may occur among a plurality of detection signals DS0 to DSy. In FIG. 21, the graph representing the readout deviations T is illustrated in a convex shape in the center of the column-axis since the power source supplying circuits 430 and 440 for supplying the power source in common to the plurality of readout circuits RD0 to RDy are disposed closest to the first readout circuit RD0 and the (y+1)$^{th}$ readout circuit RDy, respectively. Accordingly, the plurality of detection signals DS0 to DSy may be outputted with different readout time delays according to the different distances the power source supplying circuits to the respective readout circuits, so that the readout deviations T may occur among the plurality of detection signals DS0 to DSy.

Respective first resistance values suitable to achieve the direct compensation may be preset in the plurality of compensators 423_0 to 423_y according to the readout deviations T. For example, the first resistance values set in the compensators 423_0 to 423_y may be larger when the distances between the respective readout circuits and the power source supplying circuits decrease, and the first resistance values set in the compensators 423_0 to 423_y may be smaller when the distances between the respective readout circuits and the power source supplying circuits increase. The plurality of compensators 423_0 to 423_y may directly compensate for the readout deviations T among the plurality of detection signals DS0 to DSy by applying the respective first resistance values in the plurality of readout lines RL0 to RLy under the control of the activated first control signal CTRL<A>. For example, the plurality of compensators 423_0 to 423_y may decrease the readout deviations T among the plurality of detection signals DS0 to DSy when directly compensating for the readout deviations T. Accordingly, the plurality of delayed detection signals DS0' to DSy' outputted from the plurality of compensators 423_0 to 423_y may have the same readout time delays.

A plurality of counters 425_0 to 425_y may output the plurality of count signals CNT0 to CNTy corresponding to the plurality of delayed detection signals DS0' to DSy'.

Figure 22:
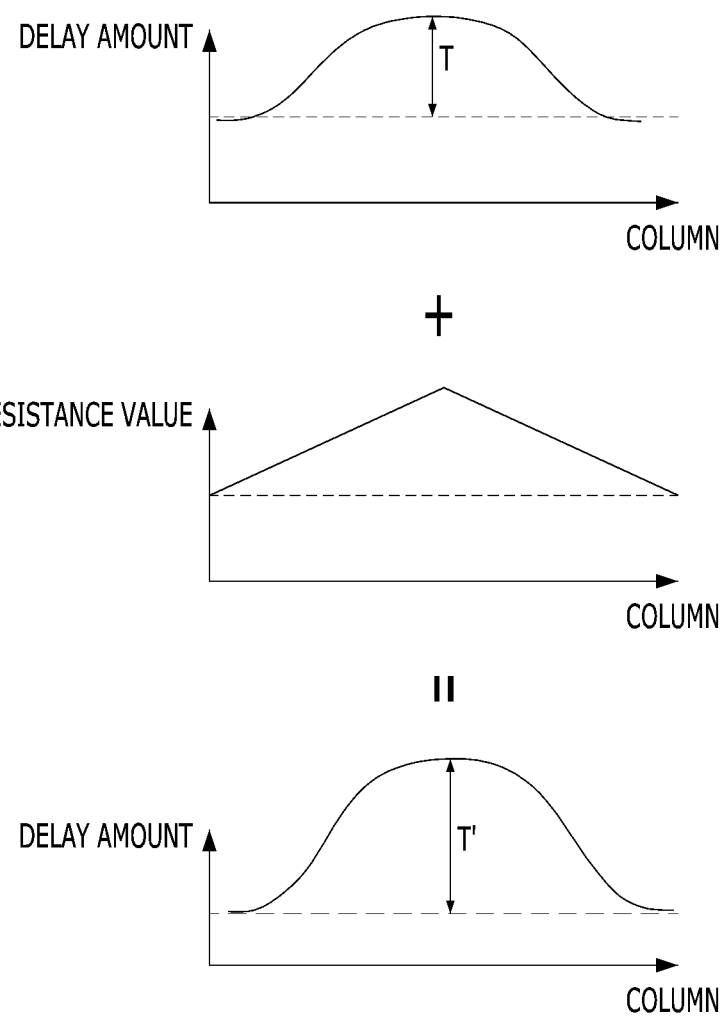
FIG. 22 is a graph showing an inverse compensation operation of the image sensing device of FIG. 17 in accordance with various embodiments of the present invention.

FIG. 22 is a graph showing an inverse compensation operation of the image sensing device 400 of FIG. 17 in accordance with various embodiments of the present invention.

Referring to FIG. 22, the operation related to the inverse compensation may be performed when the second control signal CTRL<B> of the first and second control signals CTRL<A:B> is activated.

Readout deviations T may occur among the plurality of pixel signals PS0 to PSy. Specifically, the readout deviations T may occur among a plurality of detection signals DS0 to DSy. The graph representing the readout deviation T is illustrated in a convex shape in the center of the column-axis, since the power source supplying circuits 430 and 440 for supplying the power source in common to the plurality of readout circuits RD0 to RDy are disposed closest to the first readout circuit RD0 and the (y+1)$^{th}$ readout circuit RDy, respectively. Accordingly, the plurality of detection signals DS0 to DSy may be outputted with different readout time delays according to the different distances between the respective readout circuits and the power source supplying circuits, so that the readout deviations T may occur among the plurality of detection signals DS0 to DSy.

Respective second resistance values suitable to achieve the inverse compensation may be preset in the plurality of compensators 423_0 to **423_*y* according to the readout deviations T. For example, the second resistance values set in the compensators 423_0 to 423_*y* may be larger when the distances between the respective readout circuits and the power source supplying circuits increase, and second resistance values set in the compensators 423_0 to 423_*y* may be smaller when the distances between the respective readout circuits and the power source supplying circuits decrease. The plurality of compensators 423_0 to 423_*y* may inversely compensate for the readout deviations T among the plurality of detection signals DS0 to DSy by applying the respective second resistance values in the plurality of readout lines RL0 to RLy under the control of the activated second control signal CTRL<B>. Accordingly, the difference in readout time delays among a plurality of delayed detection signals DS0' to DSy' outputted from the plurality of compensators 423_0 to 423_*y*** may be further increased. In other words, readout deviations T' among the plurality of delayed detection signals DS0' to DSy' may be increased more than the readout deviations T among the plurality of detection signals DS0 to DSy.

The plurality of counters 425_0 to **425_*y* may output the plurality of count signals CNT0 to CNTy corresponding to the plurality of delayed detection signals DS0' to DSy'. When the plurality of counters 425_0 to 425_*y* operate at similar timings, peak noise due to the plurality of counters 425_0 to 425_*y* may occur. However, since the readout deviations T' are present among the plurality of delayed detection signals DS0' to DSy', the peak noise due to the plurality of counters 425_0 to 425_*y*** may be dispersed.

According to various embodiments of the present invention, both the first resistance value necessary for directly compensating for the readout deviations among the plurality of pixel signals and the second resistance value necessary for inversely compensating for the readout deviations among the plurality of pixel signals are configured to flexibly perform the direct compensation and inverse compensation. In addition, the readout deviations among the plurality of pixel signals may be alleviated by directly compensating for the readout deviations, and the peak noise due to the plurality of counters may be dispersed by inversely compensating for the readout deviations among the plurality of pixel signals.

In accordance with the embodiments, the deterioration in characteristics caused when the plurality of pixel signals are read out is compensated for, thereby improving operational reliability.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

What is claimed is:

1. An image sensing device comprising:
   a pixel array including a plurality of pixels arranged in rows and columns, and suitable for outputting a plurality of pixel signals; and
   a plurality of readout circuits coupled to the pixel array, and suitable for compensating for readout deviations among the plurality of pixel signals by applying respective predetermined resistance values in a plurality of readout lines to which the plurality of pixel signals are read out when reading out the plurality of pixel signals.

2. The image sensing device of claim 1, wherein the plurality of readout circuits directly compensate or inversely compensate for the readout deviations among the plurality of pixel signals.

3. The image sensing device of claim 1, wherein the plurality of readout circuits decrease the readout deviations among the plurality of pixel signals when compensating for the readout deviations among the plurality of pixel signals.

4. The image sensing device of claim 1, wherein the plurality of readout circuits increase the readout deviations among the plurality of pixel signals when compensating for the readout deviations among the plurality of pixel signals.

5. An image sensing device comprising:
   a pixel array including a plurality of pixels arranged in rows and columns, and suitable for outputting a plurality of pixel signals to a plurality of column lines;
   a plurality of detectors coupled to the plurality of column lines, and suitable for outputting a plurality of detection signals, corresponding to respective voltage levels of the pixel signals, to a plurality of readout lines;
   a plurality of counters coupled to the plurality of readout lines, and suitable for counting the plurality of detection signals, respectively; and
   a plurality of compensators coupled to the plurality of readout lines, and suitable for applying respective predetermined resistance values in the plurality of readout lines;
   wherein different predetermined resistance values are applied in each of the plurality of readout lines.

6. The image sensing device of claim 5, wherein the respective predetermined resistance values are set according to readout deviations among the plurality of pixel signals.

7. The image sensing device of claim 5, wherein the respective predetermined resistance values are set to decrease readout deviations among the plurality of pixel signals.

8. The image sensing device of claim 5, wherein the respective predetermined resistance values are set to increase readout deviations among the plurality of pixel signals.

9. The image sensing device of claim 5, wherein each of the compensators comprises a load, and the load comprises a non-salicide poly resistor.

10. The image sensing device of claim 5, wherein each of the compensators comprises a load, and the load comprises a metal resistor.

11. An image sensing device comprising:
    a pixel array including a plurality of pixels arranged in rows and columns, and suitable for outputting a plurality of pixel signals to a plurality of column lines;
    a plurality of detectors coupled to the plurality of column lines, and suitable for outputting a plurality of detection signals, corresponding to respective voltage levels of the pixel signals, to a plurality of readout lines;
    a plurality of counters coupled to the plurality of readout lines, and suitable for counting the plurality of detection signals, respectively; and a plurality of compensators coupled to the plurality of readout lines, and suitable for selectively applying one of two or more resistance values in each of the readout lines under the control of two or more common control signals.

12. The image sensing device of claim 11, wherein the plurality of compensators apply different resistance values in two or more of the readout lines.

13. The image sensing device of claim 11, wherein the two or more resistance values comprise first and second resistance values, the first resistance value is set to decrease readout deviations among the plurality of pixel signals, and the second resistance value is set to increase readout deviations among the plurality of pixel signals.

14. The image sensing device of claim 11, wherein each of the compensators comprises:
   a first load;
   a second load;
   a first switch suitable for selectively coupling the first load to each of the readout lines under the control of a first common control signal of the common control signals; and
   a second switch suitable for selectively coupling the second load to each of the readout lines under the control of a second common control signal of the common control signals.

15. The image sensing device of claim 14, wherein each of the first and second loads comprises a non-salicide poly resistor.

16. The image sensing device of claim 11, wherein each of the first and second loads comprises a metal resistor.

17. The image sensing device of claim 11, wherein each of the compensators comprises:
   a plurality of loads; and
   a plurality of switches suitable for selectively coupling one or more of the plurality of loads to each of the readout lines under the control of the common control signals.

18. The image sensing device of claim 17, wherein the plurality of loads have the same resistance value.

19. The image sensing device of claim 17, wherein each of the loads comprises a non-salicide poly resistor.

20. The image sensing device of claim 17, wherein each of the loads comprises a metal resistor.

* * * * *